(12) United States Patent
Scheuerlein et al.

(10) Patent No.: US 7,495,947 B2
(45) Date of Patent: Feb. 24, 2009

(54) REVERSE BIAS TRIM OPERATIONS IN NON-VOLATILE MEMORY

(75) Inventors: Roy E. Scheuerlein, Cupertino, CA (US); Tanmay Kumar, Pleasanton, CA (US)

(73) Assignee: SanDisk 3D LLC, Milpitas, CA (US)

( * ) Notice: Subject to any disclaimer, the term of this patent is extended or adjusted under 35 U.S.C. 154(b) by 0 days.

(21) Appl. No.: 11/461,424

(22) Filed: Jul. 31, 2006

(65) Prior Publication Data
US 2008/0025068 A1    Jan. 31, 2008

(51) Int. Cl.
*G11C 7/00* (2006.01)
(52) U.S. Cl. ........................ 365/148; 365/158
(58) Field of Classification Search ................. 365/148, 365/158
See application file for complete search history.

(56) References Cited

U.S. PATENT DOCUMENTS

| | | | |
|---|---|---|---|
| 4,698,589 A | | 10/1987 | Blankenship et al. |
| 5,389,475 A | * | 2/1995 | Yanagisawa et al. .......... 430/19 |
| 5,818,749 A | | 10/1998 | Harshfield |
| 5,978,277 A | | 11/1999 | Hsu et al. |
| 6,034,882 A | | 3/2000 | Johnson et al. |
| 6,306,718 B1 | | 10/2001 | Singh et al. |
| 6,420,215 B1 | | 7/2002 | Knall et al. |
| 6,483,734 B1 | | 11/2002 | Sharma et al. |
| 6,567,287 B2 | | 5/2003 | Scheuerlein |
| 6,795,338 B2 | | 9/2004 | Parkinson et al. |
| 6,856,536 B2 | | 2/2005 | Rinerson et al. |
| 6,856,572 B2 | | 2/2005 | Scheuerlein et al. |

(Continued)

FOREIGN PATENT DOCUMENTS

EP    1426971 A    6/2004

(Continued)

OTHER PUBLICATIONS

International Search Report & The Written Opinion of the International Searching Authority, Patent Cooperation Treaty, Application No. PCT/US2007/074564, Jan. 21, 2008.

(Continued)

*Primary Examiner*—Michael T Tran
(74) *Attorney, Agent, or Firm*—Vierra Magen Marcus & DeNiro LLP

(57) ABSTRACT

A reverse bias trim operation for the reset state of a non-volatile memory system is disclosed. Non-volatile memory cells including a resistance change element undergo a reverse bias reset operation to change their resistance from a set state at a first level of resistance to a reset state at a second level of resistance. Certain memory cells in a set of cells that was reset may be deeply reset to a level of resistance beyond a target level for the reset state. A second reverse bias is applied to the set of memory cells to move the resistance of each cell that was deeply reset toward the target level of the reset state. A smaller reverse bias than used for the reset operation can shift the resistance of the cells back toward the set level and out of their deeply reset condition. The operation is self-limiting in that cells stop their resistance shifts upon reaching the target level. Cells that were not deeply reset are not affected.

22 Claims, 16 Drawing Sheets

U.S. PATENT DOCUMENTS

| | | | |
|---|---|---|---|
| 6,862,213 B2 * | 3/2005 | Hamaguchi | 365/158 |
| 6,873,561 B2 | 3/2005 | Ooishi | |
| 6,879,505 B2 | 4/2005 | Scheuerlein | |
| 6,891,749 B2 | 5/2005 | Campbell et al. | |
| 6,952,030 B2 | 10/2005 | Herner et al. | |
| 6,984,561 B2 | 1/2006 | Herner et al. | |
| 7,005,350 B2 | 2/2006 | Walker et al. | |
| 7,054,219 B1 | 5/2006 | Petti et al. | |
| 7,057,922 B2 * | 6/2006 | Fukumoto | 365/158 |
| 7,167,387 B2 * | 1/2007 | Sugita et al. | 365/148 |
| 7,221,579 B2 | 5/2007 | Krusin-Elbaum et al. | |
| 7,236,390 B1 | 6/2007 | Chang et al. | |
| 7,372,725 B2 | 5/2008 | Philipp et al. | |
| 2003/0001230 A1 | 1/2003 | Lowrey | |
| 2003/0002332 A1 | 1/2003 | Lowrey | |
| 2003/0073262 A1 | 4/2003 | Xu | |
| 2003/0173612 A1 | 9/2003 | Krieger et al. | |
| 2003/0218904 A1 | 11/2003 | Lowrey | |
| 2004/0109377 A1 | 6/2004 | Ooishi | |
| 2004/0114419 A1 | 6/2004 | Lowrey et al. | |
| 2004/0129952 A1 | 7/2004 | Griesmer et al. | |
| 2004/0160818 A1 | 8/2004 | Rinerson | |
| 2004/0228159 A1 | 11/2004 | Kostylev et al. | |
| 2004/0257882 A1 | 12/2004 | Stackhouse et al. | |
| 2004/0264234 A1 | 12/2004 | Moore et al. | |
| 2005/0018509 A1 * | 1/2005 | Hush et al. | 365/205 |
| 2005/0052915 A1 | 3/2005 | Herner et al. | |
| 2005/0098800 A1 | 5/2005 | Herner et al. | |
| 2005/0121742 A1 | 6/2005 | Petti | |
| 2005/0158950 A1 | 7/2005 | Scheuerlein et al. | |
| 2005/0162883 A1 * | 7/2005 | Nejad et al. | 365/63 |
| 2005/0167699 A1 * | 8/2005 | Sugita et al. | 257/202 |
| 2005/0226067 A1 | 10/2005 | Herner et al. | |
| 2006/0023532 A1 * | 2/2006 | Hush et al. | 365/203 |
| 2006/0067117 A1 | 3/2006 | Petti | |
| 2006/0071298 A1 | 4/2006 | Hui | |
| 2006/0091373 A1 | 5/2006 | Lee et al. | |
| 2006/0109704 A1 | 5/2006 | Seo et al. | |
| 2006/0157679 A1 * | 7/2006 | Scheuerlein | 257/2 |
| 2006/0157682 A1 | 7/2006 | Scheuerlein | |
| 2006/0160307 A1 * | 7/2006 | Joo et al. | 438/261 |
| 2006/0171194 A1 | 8/2006 | Lowrey et al. | |
| 2006/0221734 A1 | 10/2006 | Bedeschi et al. | |
| 2006/0250836 A1 | 11/2006 | Herner et al. | |
| 2006/0250837 A1 | 11/2006 | Herner et al. | |
| 2006/0273298 A1 | 12/2006 | Petti | |
| 2007/0002610 A1 * | 1/2007 | Knall | 365/175 |
| 2007/0069276 A1 | 3/2007 | Scheuerlein et al. | |
| 2007/0070690 A1 | 3/2007 | Scheuerlein et al. | |
| 2007/0072360 A1 | 3/2007 | Kumar et al. | |
| 2007/0090425 A1 | 4/2007 | Kumar et al. | |
| 2007/0114509 A1 | 5/2007 | Herner et al. | |
| 2007/0165442 A1 * | 7/2007 | Hosoi et al. | 365/100 |
| 2007/0268742 A1 | 11/2007 | Liu | |
| 2008/0023790 A1 | 1/2008 | Scheuerlein | |
| 2008/0025061 A1 | 1/2008 | Scheuerlein et al. | |
| 2008/0025062 A1 | 1/2008 | Scheuerlein et al. | |
| 2008/0025066 A1 | 1/2008 | Fasoli et al. | |
| 2008/0025067 A1 | 1/2008 | Scheuerlein et al. | |
| 2008/0025069 A1 | 1/2008 | Scheuerlein et al. | |
| 2008/0025076 A1 | 1/2008 | Scheuerlein et al. | |
| 2008/0025077 A1 | 1/2008 | Scheuerlein et al. | |
| 2008/0025085 A1 | 1/2008 | Scheuerlein et al. | |
| 2008/0025088 A1 | 1/2008 | Scheuerlein et al. | |
| 2008/0025089 A1 | 1/2008 | Scheuerlein et al. | |
| 2008/0025093 A1 | 1/2008 | Scheuerlein et al. | |
| 2008/0025094 A1 | 1/2008 | Scheuerlein et al. | |
| 2008/0025118 A1 | 1/2008 | Scheuelein | |
| 2008/0025131 A1 | 1/2008 | Scheuerlein et al. | |
| 2008/0025132 A1 | 1/2008 | Fasoli et al. | |
| 2008/0025133 A1 | 1/2008 | Scheuerlein et al. | |
| 2008/0025134 A1 | 1/2008 | Scheuerlein et al. | |

FOREIGN PATENT DOCUMENTS

| | | |
|---|---|---|
| EP | 1755126 A | 2/2007 |
| WO | WO03/085675 A1 | 10/2003 |
| WO | WO2006/039370 A2 | 4/2006 |
| WO | WO2006/121837 A | 11/2006 |
| WO | WO2007038665 A | 4/2007 |

OTHER PUBLICATIONS

U.S. Appl. No. 11/461,431, filed Jul. 31, 2006.
Non-Final Office Action, United States Patent & Trademark Office, U.S. Appl. No. 11/461,431, filed Jul. 31, 2006, May 12, 2008.
Response to Non-Final Office Action, U.S. Appl. No. 11/461,431, filed Jul. 31, 2006, Aug. 12, 2008.
Notice of Allowance and Fee(s) Due, United States Patent & Trademark Office, U.S. Appl. No. 11/461,431 filed on Jul. 31, 2006, Nov. 3, 2008.

* cited by examiner selected WL selected BL selected WL selected BL

US 7,495,947 B2

REVERSE BIAS TRIM OPERATIONS IN NON-VOLATILE MEMORY

CROSS-REFERENCE TO RELATED APPLICATIONS

The following related applications, filed on even date herewith, are cross-referenced and incorporated by reference herein in their entirety:

U.S. patent application Ser. No. 11/461,393, entitled "Controlled Pulse Operations in Non-Volatile Memory," filed concurrently;

U.S. patent application Ser. No. 11/461,399, entitled "Systems for Controlled Pulse Operations in Non-volatile Memory," filed concurrently;

U.S. patent application Ser. No. 11/461,410, entitled "High Bandwidth One Time Field-Programmable Memory," by Roy E. Scheuerlein and Christopher J. Petti;

U.S. patent application Ser No. 11/461,419, entitled "Systems For High Bandwidth One Time Field-Programmable Memory," by Roy E. Scheuerlein and Christopher J. Petti;

U.S. patent application Ser. No. 11/461,431, entitled "Systems for Reverse Bias Trim Operations in Non-volatile Memory," by Roy E. Scheuerlein and Tanmay Kumar;

U.S. patent application Ser. No. 11/496,986, entitled "Method for Using a Memory Cell Comprising Switchable Semiconductor Memory Element With Trimmable Resistance," by Tanmay Kumar, S. Brad Herner, Roy E. Scheuerlein, and Christopher J. Petti;

U.S. patent application Ser. No. 11/496,985, entitled "Multi-Use Memory Cell and Memory Array," by Roy E. Scheuerlein and Tanmay Kumar;

U.S. patent application Ser. No. 11/496,984, entitled "Method for Using a Multi-Use Memory Cell and Memory Array," by Roy E. Scheuerlein and Tanmay Kumar;

U.S. patent application Ser. No. 11/496,874, entitled "Mixed-Use Memory Array," by Roy E. Scheuerlein;

U.S. patent application Ser. No. 11/496,983, entitled "Method for Using a Mixed-Use Memory Array," by Roy E. Scheuerlein;

U.S. patent application Ser. No. 11/496,870, entitled "Mixed-Use Memory Array with Different Data States," by Roy E. Scheuerlein and Christopher J. Petti;

U.S. patent application Ser. No. 11/497,021, entitled "Method for Using a Mixed-Use Memory Array with Different Data States," by Roy E. Scheuerlein and Christopher J. Petti;

U.S. patent application Ser. No. 11/461,339, entitled "Passive Element Memory Array Incorporating Reversible Polarity Word Line and Bit Line Decoders," by Luca G. Fasoli, Christopher J. Petti, and Roy E. Scheuerlein;

U.S. patent application Ser. No. 11/461,364, entitled "Method for Using a Passive Element Memory Array Incorporating Reversible Polarity Word Line and Bit Line Decoders," by Luca G. Fasoli, Christopher J. Petti, and Roy E. Scheuerlein;

U.S. patent application Ser. No. 11/461,343, entitled "Apparatus for Reading a Multi-Level Passive Element Memory Cell Array," by Roy E. Scheuerlein, Tyler Thorp, and Luca G. Fasoli;

U.S. patent application Ser. No. 11/461,367, entitled "Method for Reading a Multi-Level Passive Element Memory Cell Array," by Roy E. Scheuerlein, Tyler Thorp, and Luca G. Fasoli;

U.S. patent application Ser. No. 11/461,352, entitled "Dual Data-Dependent Busses for Coupling Read/Write Circuits to a Memory Array," by Roy E. Scheuerlein and Luca G. Fasoli;

U.S. patent application Ser. No. 11/461,369, entitled "Method for Using Dual Data-Dependent Busses for Coupling Read/Write Circuits to a Memory Array," by Roy E. Scheuerlein and Luca G. Fasoli;

U.S. patent application Ser. No. 11/461,359, entitled "Memory Array Incorporating Two Data Busses for Memory Array Block Selection," by Roy E. Scheuerlein, Luca G. Fasoli, and Christopher J. Petti;

U.S. patent application Ser. No. 11/461,372, entitled "Method for Using Two Data Busses for Memory Array Block Selection," by Roy E. Scheuerlein, Luca G. Fasoli, and Christopher J. Petti;

U.S. patent application Ser. No. 11/461,362, entitled "Hierarchical Bit Line Bias Bus for Block Selectable Memory Array," by Roy E. Scheuerlein and Luca G. Fasoli; and U.S. patent application Ser. No. 11/461,376, entitled "Method for Using a Hierarchical Bit Line Bias Bus for Block Selectable Memory Array," by Roy E. Scheuerlein and Luca G. Fasoli.

BACKGROUND OF THE INVENTION

1. Field of the Invention

Embodiments in accordance with the present disclosure are directed to integrated circuits containing non-volatile memory cell arrays and particularly those arrays incorporating passive element memory cells.

2. Description of the Related Art

Materials having a detectable level of change in state, such as a resistance or phase change, are used to form various types of non-volatile semiconductor based memory devices. For example, simple antifuses are used for binary data storage in one time field-programmable (OTP) memory arrays by assigning a lower resistance initial physical state of a memory cell to a first logical state such as logical '0,' and assigning a higher resistance physical state of the cell to a second logical state such as logical '1.' Some materials can have their resistance switched back in the direction of their initial resistance. These types of materials can be used to form re-writable memory cells. Multiple levels of detectable resistance in materials can further be used to form multi-state devices which may or may not be re-writable.

Materials having a memory effect such as a detectable level of resistance are often placed in series with a steering element to form a memory device. Diodes or other devices having a non-linear conduction current are typically used as the steering element. In many implementations, a set of word lines and bit lines are arranged in a substantially perpendicular configuration with a memory cell at the intersection of each word line and bit line. Two-terminal memory cells can be constructed at the intersections with one terminal (e.g., terminal portion of the cell or separate layer of the cell) in contact with the conductor forming the respective word line and another terminal in contact with the conductor forming the respective bit line.

In such cases, the bias conditions during read and write operations are an important consideration when implementing non-volatile memory arrays having passive element memory cells comprising switchable resistance materials or phase change materials as the state change element. High leakage currents, program disturbances, read disturbances, etc. can pose difficulties when attempting to produce a memory device comprising one or more arrays of passive element memory cells that can be reliably fabricated, programmed, and read. These factors often limit system performance by reducing the number of cells that can be simultaneously addressed in order to keep leakage currents at acceptable levels, for example. Slight differences between individual memory cells can also pose a difficulty when attempting to address multiple cells individually or concurrently for high bandwidth read and program operations. Certain cells can have properties that can lead to resistances out of a range associated with a corresponding data state after these operations. For example, particular cells may undergo different amounts of shift in resistance when compared to other cells that are subjected to the same bias conditions.

SUMMARY OF THE INVENTION

A reverse bias trim operation for the reset state of a non-volatile memory system is disclosed. Non-volatile memory cells including a resistance change element undergo a reverse bias reset operation to change their resistance from a set state at a first level of resistance to a reset state at a second level of resistance. Certain memory cells in a set of cells that was reset may be deeply reset to a level of resistance beyond a target level for the reset state. A second reverse bias is applied to the set of memory cells to move the resistance of each cell that was deeply reset toward the target level of the reset state. A smaller reverse bias than used for the reset operation can shift the resistance of the cells back toward the set level and out of their deeply reset condition. The operation is self-limiting in that cells stop their resistance shifts upon reaching the target level. Cells that were not deeply reset are not affected.

In one embodiment, a method of operating non-volatile storage is provided that includes applying a first level of reverse bias to a plurality of non-volatile storage elements to move a resistance of each storage element in a first direction from a first resistance state to a second resistance state. The method then includes applying a second level of reverse bias to the plurality of non-volatile storage elements to move a resistance of a subset of the plurality of storage elements that have a resistance beyond a target resistance level for the second resistance state in a second direction toward the target resistance level.

In one embodiment, a method of operating non-volatile storage is provided that includes switching a plurality of non-volatile storage elements from a lower resistance state to a higher resistance state by applying a first level of reverse bias to the storage elements. A second level of reverse bias is then applied to the storage elements to lower a resistance of a subset of the storage elements that have a resistance beyond a target level corresponding to the second resistance state after switching.

A non-volatile memory system is provided in one embodiment that includes a plurality of non-volatile storage elements having at least one resistance change element and control circuitry in communication with the plurality of non-volatile storage elements. The control circuitry performs a reset operation that includes the plurality of non-volatile storage elements by applying at least one reverse bias reset voltage to reset the storage elements from a lower resistance set state to a higher resistance reset state, and applying at least one reverse bias trim voltage to the plurality of non-volatile storage elements to lower a resistance of a subset of the plurality of non-volatile storage elements having a resistance beyond a target value for the second higher resistance reset state.

DETAILED DESCRIPTION

Figure 1:
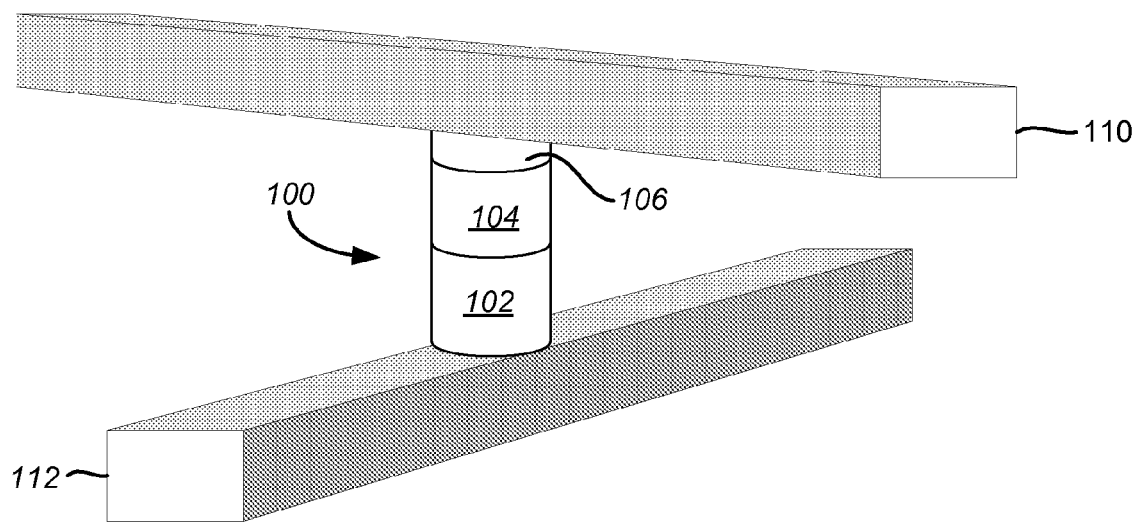
FIG. 1 depicts an exemplary non-volatile memory cell in accordance with one embodiment.

FIG. 1 depicts an exemplary structure for a non-volatile memory cell that can be used in accordance with embodiments of the present disclosure. A two-terminal memory cell 100 as depicted in FIG. 1 includes a first terminal portion connected to a first conductor 110 and a second terminal portion connected to a second conductor 112. The memory cell includes a steering element 102 in series with a state change element 104 and an anti-fuse 106 to provide non-volatile date storage. The steering element can take the form of any suitable device exhibiting a nonlinear conduction current characteristic such as a simple diode. The state change element will vary by embodiment and can include numerous types of materials to store data through representative physical states. State change element 104 can include resistance change materials, phase change resistive materials, etc. For example, a semiconductor or other material having at least two levels of detectable resistance change (e.g., low to high and high to low) is used in one embodiment to form a passive storage element 100. By assigning logical data values to the various levels of resistance that can be set and read from resistance change element 104, memory cell 100 can provide reliable data read/write capabilities. Anti-fuse 106 can further provide resistance state change abilities that can be exploited for non-volatile data storage. An anti-fuse is manufactured in a high resistance state and can be popped or fused to a lower resistance state. An anti-fuse is typically non-conductive in its initial state and exhibits high conductivity with low resistance in its popped or fused state. As a discreet device or element may have a resistance and different resistance states, the terms resistivity and resistivity state are used to refer to the properties of materials themselves. Thus, while a resistance change element or device may have resistance states, a resistivity change material may have resistivity states.

Anti-fuse 106 can provide benefits to memory cell 100 beyond its state change ability. For example, an anti-fuse can serve to set the on-resistance of the memory cell in at an appropriate level relative to the read-write circuitry associated with the cell. These circuits are typically used to pop the anti-fuse and have an associated resistance. Because these circuits drive the voltages and current levels to pop the anti-fuse, the anti-fuse tends to set the memory cell in an appropriate on-resistance state for these same circuits during later operations.

It will be appreciated that other types of two-terminal non-volatile memory cells can be used in embodiments. For example, one embodiment does not have an anti-fuse 106 and merely includes state change element 104 and steering element 102. Other embodiments may include additional state change elements in place of or in addition to the anti-fuse. Various types of suitable memory cells are described in U.S. Pat. No. 6,034,882 entitled "Vertically Stacked Field Programmable Non-volatile Memory and Method of Fabrication." Various other types of cells may be used, including those described in U.S. Pat. No. 6,420,215 and U.S. patent application Ser. No. 09/897,705 entitled "Three-Dimensional Memory Array Incorporating Serial Chain Diode Stack" filed on Jun. 29, 2001, and U.S. patent application Ser. No. 09/560,626 entitled "Three-Dimensional Memory Array and Method of Fabrication" filed on Apr. 28, 2000, all hereby incorporated by reference in their entirety.

A variety of materials exhibit resistivity change behavior suitable for implementing state change element 104 in accordance with embodiments of the present disclosure. Examples of suitable materials for resistance state change element 104 include, but are not limited to doped semiconductors (e.g., polycrystalline silicon, more commonly polysilicon), transition metal oxides, complex metal oxides, programmable metallization connections, phase change resistive elements, organic material variable resistors, carbon polymer films, doped chalcogenide glass, and Schottky barrier diodes containing mobile atoms that change resistance. The resistivity of these materials in some cases may only be set in a first direction (e.g., high to low), while in others, the resistivity may be set from a first level (e.g., higher resistance) to a second level (e.g., lower resistance), and then reset back to the first resistivity level.

A range of resistance values can be assigned to a physical data state to accommodate differences amongst devices as well as variations within devices after set and reset cycling. The terms set and reset are typically used, respectively, to refer to the process of changing an element from a high resistance physical state to a low resistance physical state (set) and changing an element from a low resistance physical state to a higher resistance physical state (reset). Embodiments in accordance with the present disclosure can be used to set memory cells to a lower resistance state or to reset memory cells to a higher resistance state. While specific examples may be provided with respect to set or reset operations, it will be appreciated that these are mere examples and that the disclosure is not so limited.

Conductors 110 and 112 are typically orthogonal to one another and form array terminal lines for accessing an array of memory cells 100. The array terminal lines (also called array lines) at one layer may be termed word lines or X-lines. The array lines at a vertically adjacent layer may be termed bit lines or Y-lines. A memory cell can be formed at the projected intersection of each word line and each bit line, and connected between the respective intersecting word line and bit line as shown for the formation of memory cell 100. A three-dimensional memory array which has at least two levels of memory cells (i.e., two memory planes) may utilize more than one layer of word lines and/or more than one layer of bit lines. A monolithic three dimensional memory array is one in which multiple memory levels are formed above a single substrate, such as a wafer, with no intervening substrates.

Figure 2A:
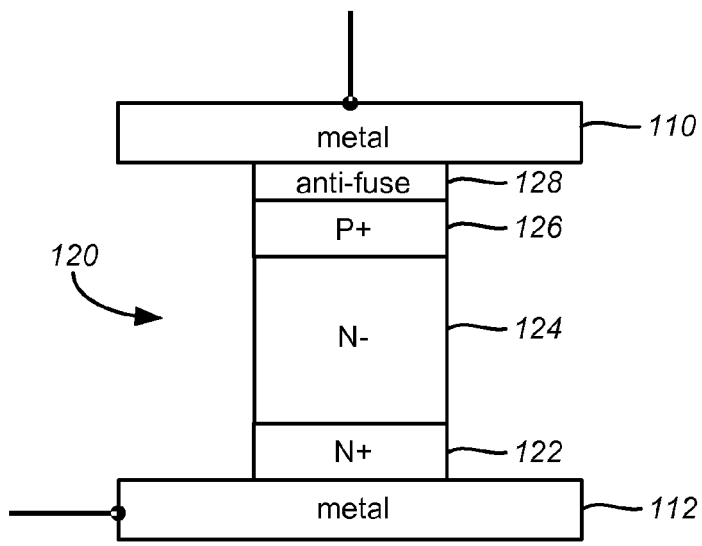
FIGS. 2A and 2B depict exemplary non-volatile memory cells in accordance with one embodiment.
Figure 2B:
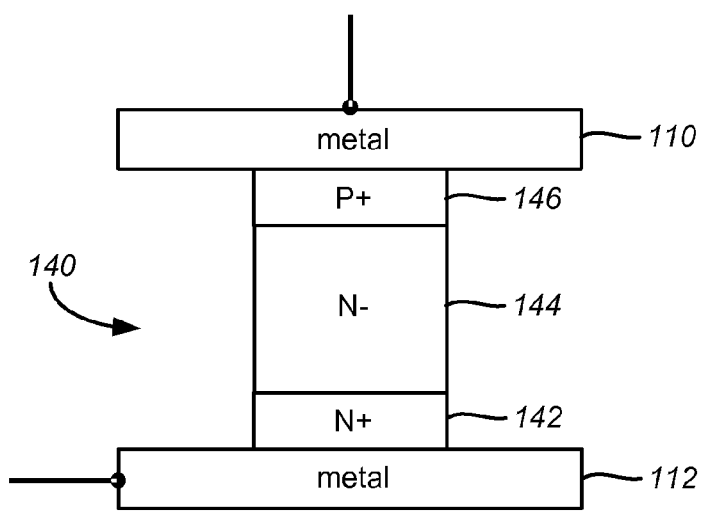

FIGS. 2A and 2B are more detailed depictions of exemplary memory cells that may be used in various embodiments. In FIG. 2A, memory cell 120 is formed between first and second metal conductive layers 110 and 112. The memory cell includes a p-i-n type diode having a heavily doped n-type region 122, intrinsic region 124, and a heavily doped p-type region 126. In other embodiment, region 122 can be p-type and region 126 n-type. Region 124 is intrinsic, or not intentionally doped, though in some embodiments it may be lightly doped. Undoped regions may not be perfectly electrically neutral, resulting from defects, contaminants, etc. that may cause it to behave as if slightly n-doped or p-doped. Such a diode is still considered a p-i-n type diode having an intrinsic middle layer. Other types of diodes such as p-n junction diodes can also be used.

Between doped p-type region 126 and conductor 110 is an anti-fuse 128. Anti-fuse 128 exhibits substantially non-conductive properties in its initial state and substantially conductive properties in its set state. Various types of anti-fuses can be used in accordance with embodiments. In typically fabricated anti-fuses, a large bias applied across the anti-fuse will fuse the forming material causing the anti-fuse to become substantially conductive. This operation is typically referred to as popping the anti-fuse.

Memory cell 120 further includes a state change element that is formed from one or more layers of the diode. It has been discovered that materials used to form the diodes in some memory cells themselves exhibit resistive change abilities. For example, in one embodiment the intrinsic region of the diode is formed of polysilicon which has demonstrated abilities to be set from a higher resistivity state to a lower resistivity state, and then reset back to a higher resistivity state from the lower resistivity state. Accordingly, the diode itself, or a portion thereof, may also form the state change element 104 as illustrated in FIG. 1. In other embodiments, one or more additional layers may be included in memory cell 120 to form a state change element as shown in FIG. 1. For example, an additional layer of polysilicon, transition metal oxide, etc. as described above may be included in the cell to provide a state change memory effect. This additional layer may be included between the diode and conductor 112, between the diode and the anti-fuse 128, or between the anti-fuse and conductor 110.

FIG. 2B illustrates a simple memory cell configuration where an anti-fuse 128 is not present. Memory cell 140 simply includes heavily doped n-type region 142, intrinsic region 144, and heavily doped p-type region 146. One or more layers of the diode formed from these regions serves as the memory effect for the cell as described above. Memory cell 140 could also include other layers to form an additional state change element for the cell in one embodiment.

Figure 3A:
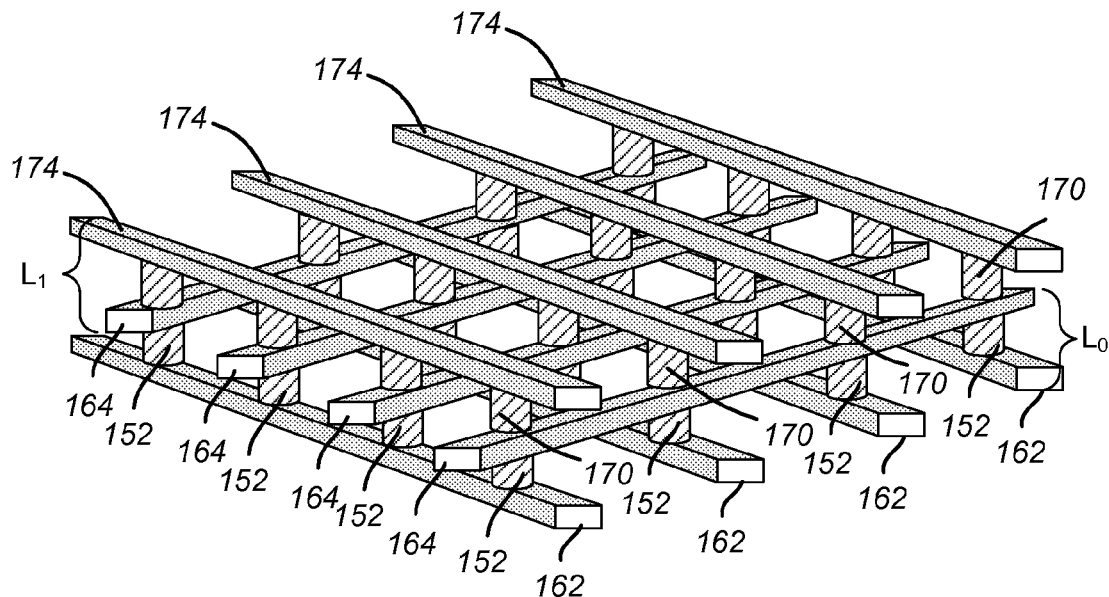
FIGS. 3A and 3B are respective perspective and cross-sectional views of a three-dimensional memory array in accordance with one embodiment.
Figure 3B:
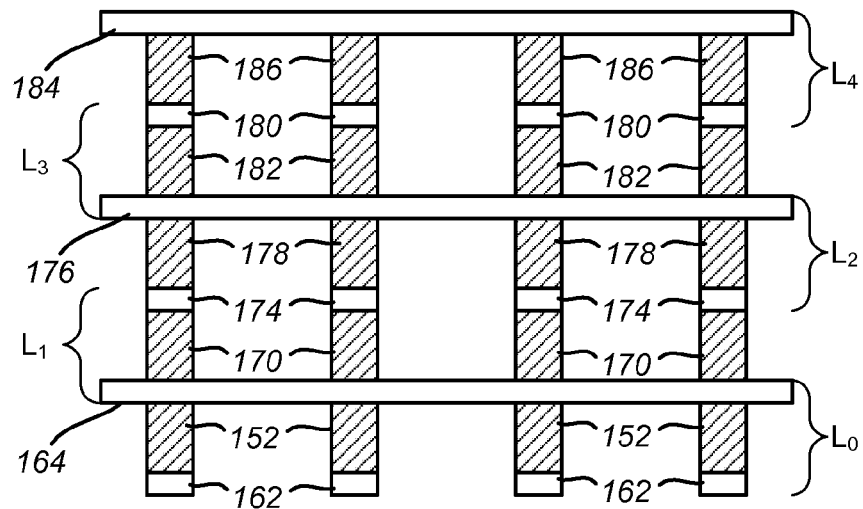

FIGS. 3A-3B depict a portion of an exemplary monolithic three-dimensional memory array as can be used in one embodiment. However, other memory structures can be used in accordance with various embodiments, including two-dimensional memory structures manufactured on, above, or within a semiconductor substrate. Both the word line and bit line layers are shared between memory cells in the structure depicted in the perspective view of FIG. 3A. This configuration is often referred to as a fully mirrored structure. A plurality of substantially parallel and coplanar conductors form a first set of bit lines 162 at a first memory level L0. Memory cells 152 at level L0 are formed between these bit lines and adjacent word lines 164. In the arrangement of FIGS. 3A-3B, word lines 164 are shared between memory layers L0 and L1 and thus, further connect to memory cells 170 at memory level L1. A third set of conductors form the bit lines 174 for these cells at level L1. These bit lines 174 are in turn shared between memory levels L1 and memory level L2, depicted in the cross-sectional view of FIG. 3B. Memory cells 178 are connected to bit lines 174 and word lines 176 to form the third memory level L2, memory cells 182 are connected to word lines 176 and bit lines 180 to form the fourth memory level L3, and memory cells 186 are connected to bit lines 180 and word lines 184 to form the fifth memory level L5. The arrangement of the diodes' polarity and the respective arrangement of the word lines and bit lines can vary by embodiment. Additionally, more or less than five memory levels can be used.

If p-i-n diodes are used as steering elements for the memory cells in the embodiment of FIG. 3A, the diodes of memory cells 170 can be formed upside down relative to the p-i-n diodes of the first level of memory cells 152. For example, if cells 152 include a bottom heavily doped region that is n-type and a top heavily doped region that is p-type, then in the second level of cells 170, the bottom heavily doped region may be p-type while the top heavily doped region is n-type.

In an alternative embodiment, an inter-level dielectric can be formed between adjacent memory levels. No conductors are shared between memory levels. This type of structure for three-dimensional monolithic storage memory is often referred to as a non-mirrored structure. In some embodiments, adjacent memory levels that share conductors and adjacent memory levels that do not share conductors can be stacked in the same monolithic three dimensional memory array. In other embodiments, some conductors are shared while others are not. For example, only the word lines or only the bit lines can be shared in some configurations. A first memory level L0 can include memory cells between a bit line level BL0 and word line level WL0. The word lines at level WL0 can be shared to form cells at a memory level L1 that connect to a second bit line level BL1. The bit line layers are not shared so the next layer can include an interlayer dielectric to separate bit lines BL1 from the next level of conductors. This type of configuration is often referred to as half-mirrored. Memory levels need not all be formed having the same type of memory cell. If desired, memory levels using resistive change materials can alternate with memory levels using other types of memory cells, etc.

In one embodiment as described in U.S. Pat. No. 7,054, 219, entitled, "Transistor Layout Configuration for Tight Pitched Memory Array Lines," word lines are formed using word line segments disposed on different word line layers of the array. The segments can be connected by a vertical connection to form an individual word line. A group of word lines, each residing on a separate layer and substantially vertically-aligned (notwithstanding small lateral offsets on some layers), may be collectively termed a row. The word lines within a row preferably share at least a portion of the row address. Similarly, a group of bit lines, each residing on a separate layer and substantially vertically-aligned (again, notwithstanding small lateral offsets on some layers), may be collectively termed a column. The bit lines within a column preferably share at least a portion of the column address.

Figure 4:
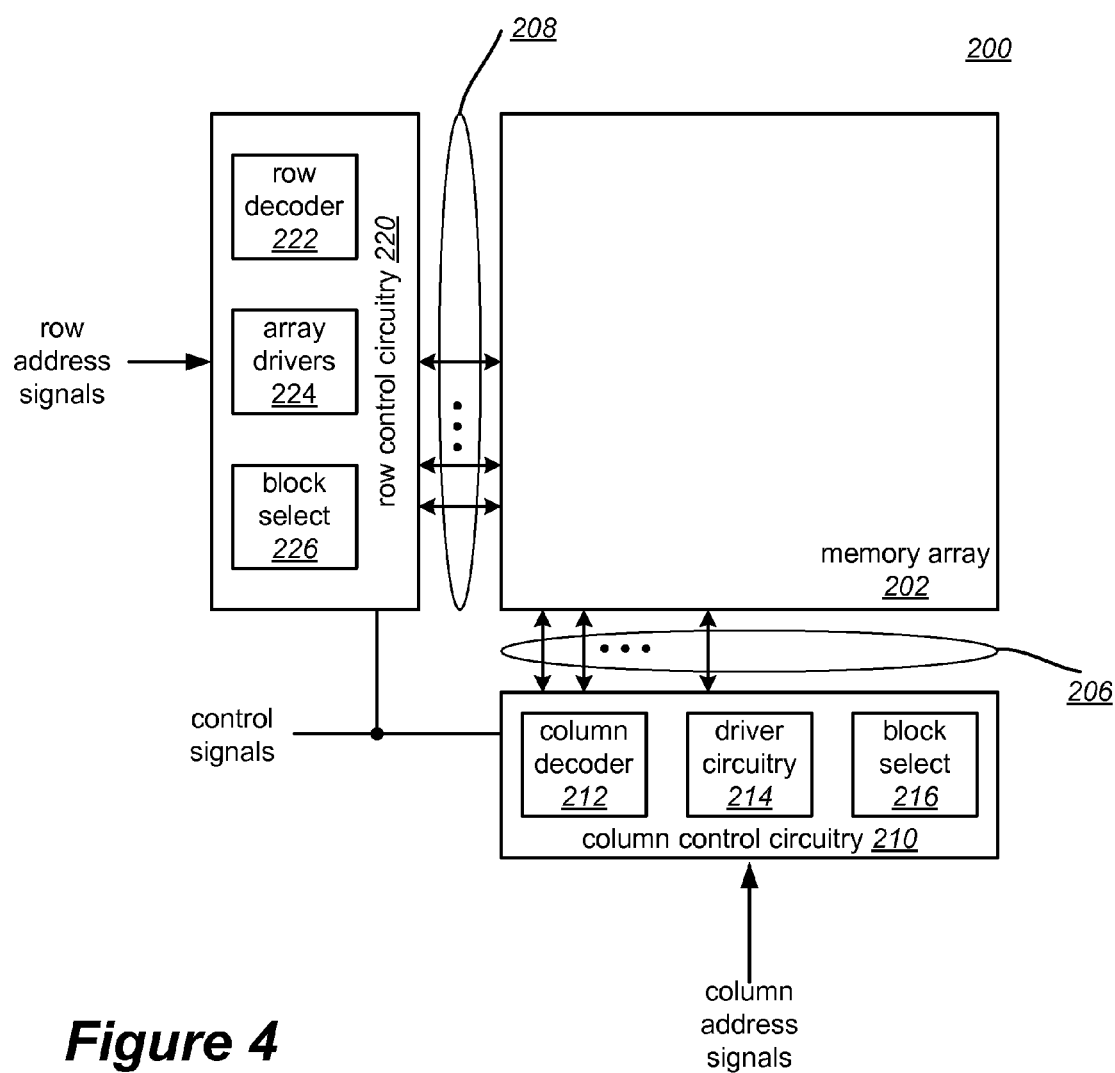
FIG. 4 is block diagram of a non-volatile memory system in accordance with one embodiment.

FIG. 4 is a block diagram of an integrated circuit including a memory array 202. The array terminal lines of memory array 202 include the various layer(s) of word lines organized as rows, and the various layer(s) of bit lines organized as columns. The integrated circuit 200 includes row control circuitry 220 whose outputs 208 are connected to respective word lines of the memory array 202. The row control circuitry receives a group of M row address signals and one or more various control signals, and typically may include such circuits as row decoders 222, array terminal drivers 224, and block select circuitry 226 for both read and write (i.e., programming) operations. The integrated circuit 200 also includes column control circuitry 210 whose input/outputs 206 are connected to respective bit lines of the memory array 202. The column control circuitry 206 receives a group of N column address signals and one or more various control signals, and typically may include such circuits as column decoders 212, array terminal receivers or drivers 214, block select circuitry 216, as well as read/write circuitry, and I/O multiplexers. Circuits such as the row control circuitry 220 and the column control circuitry 210 may be collectively termed control circuitry or array terminal circuits for their connection to the various array terminals of the memory array 202.

Integrated circuits incorporating a memory array usually subdivide the array into a sometimes large number of sub-arrays or blocks. Blocks can be further grouped together into bays that contain, for example, 16, 32, or a different number of blocks. As frequently used, a sub-array is a contiguous group of memory cells having contiguous word and bit lines generally unbroken by decoders, drivers, sense amplifiers, and input/output circuits. This is done for any of a variety of reasons. For example, the signal delays traversing down word lines and bit lines which arise from the resistance and the capacitance of such lines (i.e., the RC delays) may be very significant in a large array. These RC delays may be reduced by subdividing a larger array into a group of smaller sub-arrays so that the length of each word line and/or each bit line is reduced. As another example, the power associated with accessing a group of memory cells may dictate an upper limit to the number of memory cells which may be accessed simultaneously during a given memory cycle. Consequently, a large memory array is frequently subdivided into smaller sub-arrays to decrease the number of memory cells which are simultaneously accessed. Nonetheless, for ease of description, an array may also be used synonymously with sub-array to refer to a contiguous group of memory cells having contiguous word and bit lines generally unbroken by decoders, drivers, sense amplifiers, and input/output circuits. An integrated circuit may include one or more than one memory array.

Figure 5:
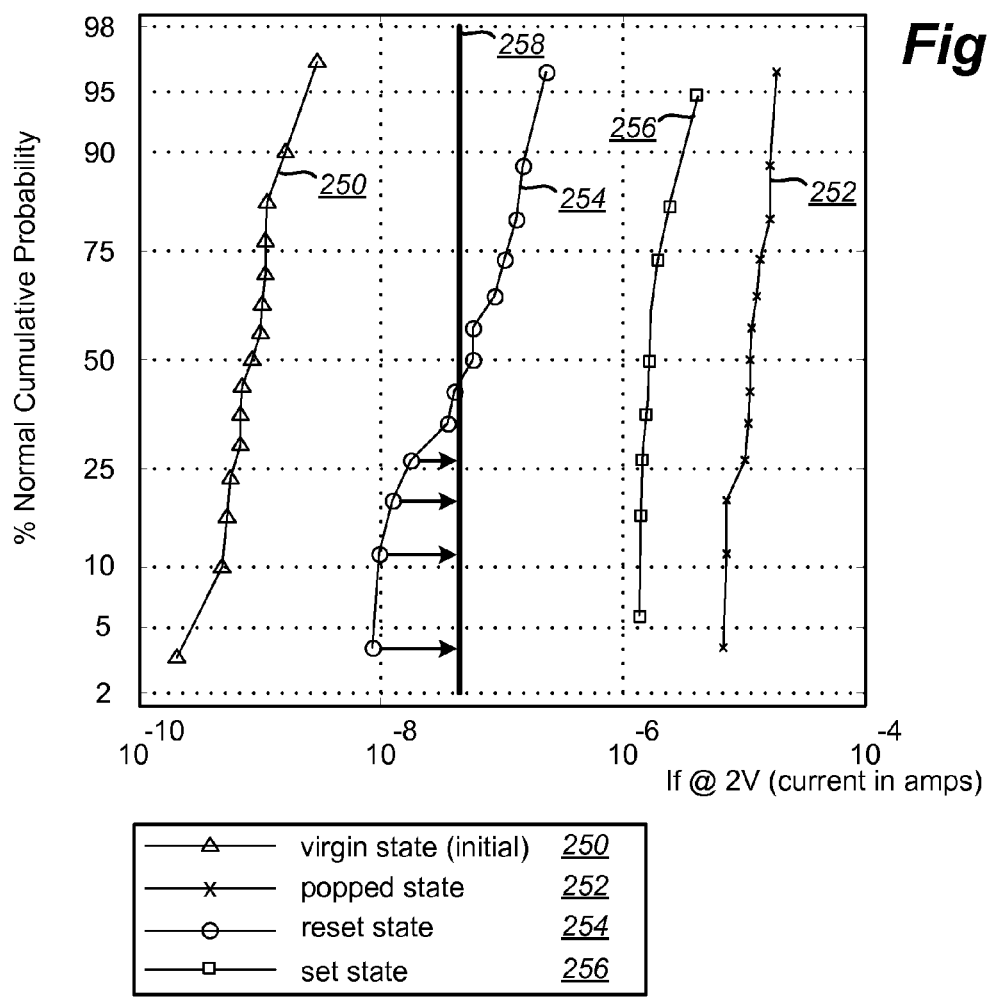
FIG. 5 is a graph depicting the distributions of resistance for the various states of a non-volatile memory system in accordance with one embodiment.

FIG. 5 is a graph depicting the distribution of resistance for the states of a set of memory cells in a non-volatile memory system in accordance with one embodiment. The exemplary memory system depicted in FIG. 5 utilizes four resistance states, although embodiments in accordance with the present disclosure can be used with systems utilizing a different number and/or combination of resistance states. The virgin (or initial) state of the set of memory cells is depicted by line 250. The distribution of resistance for these cells in their initial states after fabrication is shown as a probability function based on the cell's conduction current under a selected voltage bias (e.g., 2V). The virgin state of the cells after fabrication is a higher resistance state, having a conduction current of about $10^{-10}$ A to $10^{-9}$ A under the selected voltage.

A popped state of the device is depicted at line 252. State 252 corresponds to a lowest resistance state of the device. The devices in state 252 exhibit a conduction current of about $10^{-5}$ A under the applied voltage level of 2V depicted in FIG. 5. Memory cells can be set from their highest resistance initial state to the lowest resistance popped state by popping an anti-fuse in one embodiment. In other embodiments, a resistivity of a resistance change material such as polysilicon or a metal oxide can be switched to set cells into this lower resistance state. In one embodiment, popping an anti-fuse to set devices into a popped state as depicted at line 252 includes applying a large forward bias to the cells, such as about 8V. Other techniques, bias conditions, and/or voltage levels can also be used for these operations.

Line 254 depicts the distribution of resistance for the set of memory cells after being reset to a higher resistance reset state from the lower resistance state depicted at line 252. Memory cells in this reset state exhibit a conduction current of about $10^{-8}$ A to $10^{-7}$ A under the applied 2V voltage level. The reset state is at a lower resistance than the higher resistance initial state but in other embodiments could be at a higher resistance. A reverse bias reset operation as described hereinafter can be used in one embodiment to reset the resistance of the memory cells from state 252 to state 254. For example, the resistivity of a resistivity change material in each cell can be increased by subjecting the memory cells to a reverse bias voltage on the order of about −10V to −12V in one embodiment.

Line 256 depicts a set state of the memory cells. Memory cells may be set from their higher resistance reset state 254 to a lower resistance set state 256. Memory cells in set state 256 have a conduction current of about $10^{-6}$ A under the applied 2V voltage level. The resistance of cells in set state 256 is higher than that of the cells when in popped state 252, but lower than that of the cells in reset state 254. A forward bias of about +8V can be used in one embodiment to switch the resistance of a memory cell from reset state 254 to set state 256. In other embodiments, other bias conditions and/or voltage levels can be used for setting the memory cells.

The four resistance states depicted in FIG. 5 can be used to form a variety of types of memory systems. In one embodiment, the reset state transition is used for a field-programming operation in a one-time programmable memory array. A memory cell incorporating a resistance change element is factory-set to lower resistance state 252 from initial state 250. The memory array including the memory cell is then provided to an end-user. The lower resistance state obtained by setting the cell from its higher resistance initial state during manufacturing corresponds to a formatted or unprogrammed state of the cell. Circuitry is provided with the memory array to reset selected memory cells to higher resistance state 254 in accordance with data received from an end-user or host device in communication with the memory cell.

The four resistance states are used to form a multi-state memory system in another embodiment. Memory cells can be programmed from initial state 250 to any of states 252, 254, or 256 (or left in state 250) in accordance with user data. Each cell can store 2 bits of data in one such embodiment. A re-writable memory system can be formed in another embodiment. Cells can be set to state 256 and then reset back to state 254 multiple times to form a one bit re-writable array. Other types of memory systems can also be used in accordance with embodiments, including by way of non-limiting example U.S. patent application Ser. No. 11/496,985, entitled "Multi-Use Memory Cell and Memory Array," U.S. patent application Ser. No. 11/496,874, entitled "Mixed-Use Memory Array," U.S. patent application Ser. No. 11/496,870, entitled "Mixed-Use Memory Array with Different Data States," and U.S. patent application Ser. No. 11/496,986, entitled "Method For Using A Memory Cell Comprising Switchable Semiconductor Memory Element with Trimmable Resistance."

Biasing arrays of two-terminal memory cells for reading, setting, or resetting states can give rise to program disturbances, read disturbances, as well as high leakage currents that can affect power consumption as well as the reliability of the read and programming operations. For example, when selecting particular memory cells within an array for particular operations, the bias conditions may cause inadvertent leakage currents through unselected memory cells. These leakage currents may be present despite the use of steering elements within the memory array. The diodes of unselected memory cells may conduct small amounts of current when subjected to small positive or negative bias conditions.

Consider a forward bias reset operation implemented in some two-terminal memory arrays as an erase operation, for example. With the steering elements configured from bit line to word line, a large positive bias is created by applying a large voltage to a selected bit line and a low voltage or ground condition to a selected word line. Unselected bit lines may be at a small positive bias and unselected word lines at a large positive bias. With the memory array biased in this manner, unacceptable levels of leakage currents through the half-selected cells along the selected word line or bit line as well as through the unselected cells along an unselected word line and bit line may be present in some cases. Likewise, unacceptable levels of leakage currents may occur during a forward bias set operation as may be used for programming an array of memory cell. The cumulative effect of small leakage currents through unselected cells limits the numbers of selected memory cells that can be operated upon at one time.

It has been discovered that a reverse bias can be applied to memory cells with resistance change elements to alter a detectable resistance of the cell. Materials such as metal oxides, polysilicon, etc. described above, can be reset from a lower resistivity state to a higher resistivity state, for example, by subjecting the material to a voltage pulse that creates a reverse bias across the material. A reverse bias is applied during a reset operation in one embodiment to minimize leakage currents through the memory array. An essentially zero bias can be provided to certain unselected memory cells in some implementations. Because the leakage currents are minimized, a larger number of memory cells can be selected for reset operations. This provides an improvement to operational specifications by decreasing programming and/or erase times. Moreover, the low leakage currents can facilitate more reliable operations by normalizing device performance within expected levels. U.S. patent application Ser. No. 11/461,339, entitled "Passive Element Memory Array Incorporating Reversible Polarity Word Line and Bit Line Decoders," discloses a reverse bias operation that can be used to minimize leakage currents through unselected and half-selected memory cells.

Figure 6:
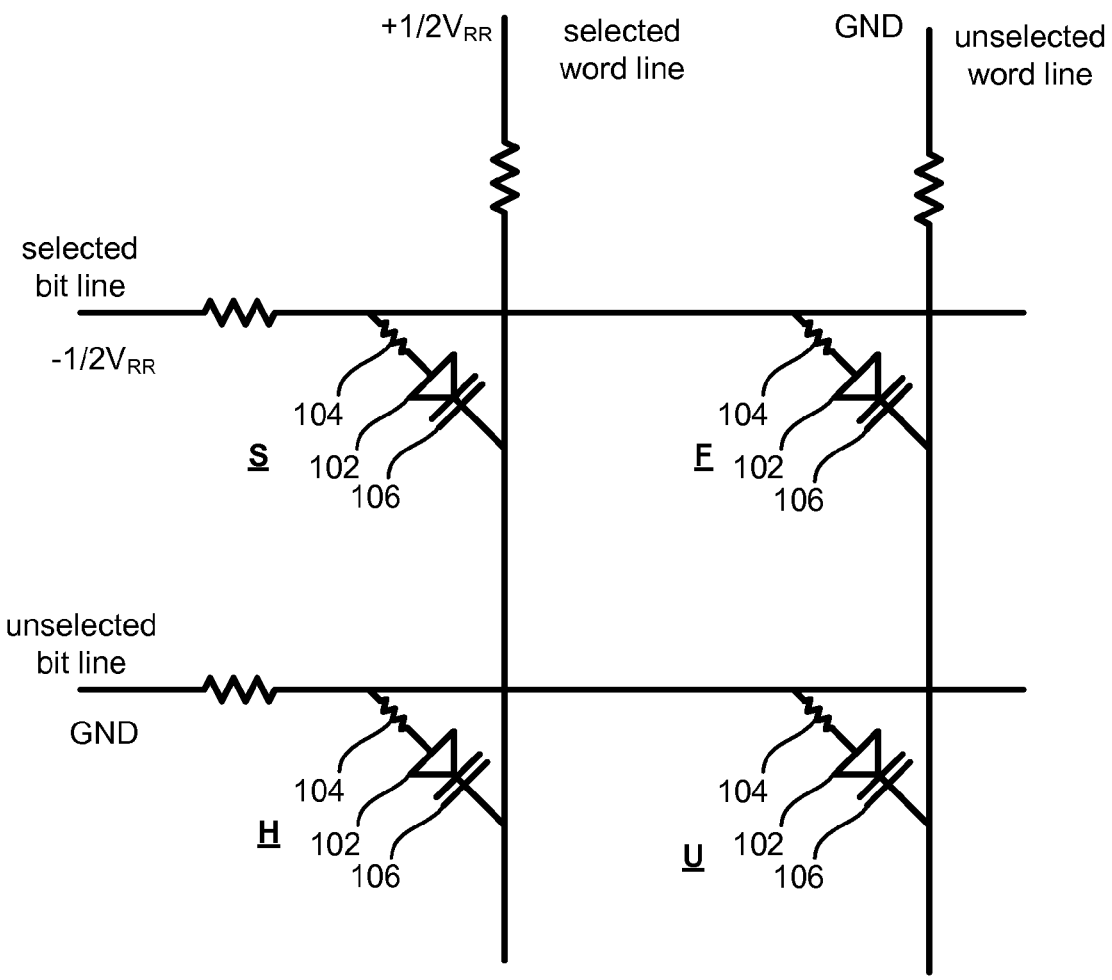
FIG. 6 is a simplified circuit diagram of a memory array illustrating the bias conditions for a reverse bias reset operation in accordance with one embodiment.

FIG. 6 is a circuit diagram of a portion of a memory array during a reverse bias operation in accordance with one embodiment. The reverse bias conditions can be used to set memory cells to a low resistance state or reset memory cells to a high resistance state. Specific reference to a reset operation may be made hereinafter for convenience but is not meant as a limitation on application of the disclosed biases and techniques. One or more selected word lines are at a positive bias and one or more selected bit lines are at a negative bias. For example, the selected word lines may receive a reset voltage signal $V_{WR}$ of $+\frac{1}{2}V_{RR}$ while the selected bit lines are driven at a negative bias of about $-\frac{1}{2}V_{RR}$ through reset voltage signal $V_{BR}$. $V_{RR}$ is the amount of reverse bias (or negative voltage) needed to reset the memory and can vary by embodiment. In one exemplary implementation $V_{RR}$ is about 12V such that the selected word lines receive +6V and the selected bit lines receive −6V to create the 12V reverse bias level. The unselected word lines and bit lines are both grounded. The steering elements for the selected memory cells (denoted S) are reverse biased, passing a reverse current through the resistance change material for the selected cells. Under this reverse bias condition, the resistance change material switches from a first resistance state to a second resistance state. The bias conditions depicted in FIG. 6 advantageously provide a zero bias condition for the unselected cells (denoted U). Thus, low leakage currents through unselected and half-selected memory cells during program operations can be achieved. F denotes a half selected memory cell along a selected bit line and H denotes a half-selected memory cell along a selected word line. Additionally, the selected levels of $+/-\frac{1}{2}V_{RR}$ for the selected array lines provide less load on the driver circuitry necessary to generate the voltage level for the reverse bias reset operation. By splitting the bias using positive and negative voltage levels across the array lines, the driver circuitry need only generate half the overall voltage level required in some implementations.

Other bias conditions may also be used to reverse bias the selected memory cells for a reset operation. In one embodiment for example, a positive voltage bias (e.g., $V_{RR}$) can be applied to the selected word line and the selected bit line grounded. The unselected word and bit lines each can receive $+\frac{1}{2}V_{RR}$. This bias scenario will also provide a reverse bias to the selected memory cells that can be used to reset the cells back to a higher resistance state after a set operation. More information regarding reverse bias operations can be found in U.S. U.S. patent application Ser. No. 11/461,339, entitled "Passive Element Memory Array Incorporating Reversible Polarity Word Line and Bit Line Decoders."

It is possible in some memory implementations that a distribution of resistance for an array of memory cells in a reset state may be too wide or include a larger range of resistances than desired. For example, the distribution of resistance for the memory cells in the reset state depicted at line 252 of FIG. 5 includes a relatively large range of resistances. Some memory cells exhibit a conduction current of about $10^{-8}$ A under the applied voltage level while others in the same physical state exhibit a larger conduction current of about $10^{-7}$ A. These conduction currents evidence a large difference in resistance between cells that are all intended for the same reset physical state. Importantly, the memory cells that are deeply reset to a very high resistance (those closer to a conduction current of $10^{-8}$ A) are not widely separated from the memory cells in virgin or initial state 250. The lack of margin between these two physical states may prove problematic during read and write operations in some implementations. A large range of resistance may lead to erroneous readings of data stored in the memory cells. For example, cells that are deeply reset to a very high resistance may not conduct sufficiently under application of a read reference voltage to indicate that they are in the reset physical state. These cells may be mistaken as being in initial or virgin state 250. During other operations such as programming, these cells may be incorrectly read during a verify step, leading to the erroneous application of additional programming voltages that may not be needed.

In accordance with one embodiment, a trim operation is used with, or incorporated within, a reset operation to provide a smaller distribution of resistance for memory cells in a reset state. A trim bias can be applied to memory cells after being reset to shift deeply reset cells back toward a desired or target level associated with the reset cells. Memory cells having a resistance larger than a threshold level after being reset can have their resistance lowered to more closely match that of other cells in the reset state.

A self-limiting reverse bias trim operation is used in one embodiment. It has been discovered that the application of a small reverse bias to memory cells can increase their resistance, rather than decrease it as occurs under application of a larger reverse bias for the reset operation.

The effects of utilizing a reverse bias trim operation with a reverse bias reset operation are depicted in FIG. 5. Line 258 represents a target resistance (or desired average resistance) of memory cells in the reset state 254. Different resistive materials may provide different target levels of resistance based on their individual properties. The target resistance for the reset state can depend on these properties which tend to indicate a level to which the material most naturally resets. A certain number of cells have their resistance below the target level in FIG. 5 while others have their resistance above the target level. An amount of reverse bias, lower than the reverse bias reset level $V_{RR}$, is applied that results in memory cells with a resistance above the desired level 258 being shifted to a lower resistance. A relatively small amount of reverse bias has been discovered to decrease the resistance of resistive change materials in a self-limiting manner. Cells having a resistance at or above a particular level will have their resistance increased when subjected to a small reverse bias. Cells below the particular level of resistance, however, are not affected by the reverse bias. A range of levels for the reverse bias have been shown to have similar effects on the resistance of cells in one implementation. For example, a reverse bias of about 10V to 12V can increase the resistance of a selected memory cell by approximately the amount illustrated in FIG. 5 during a reset operation from state 252 to state 254. A reverse bias equal to about 50-60% (e.g., 6V to 7V) of that applied during the reset operation can be used to increase the resistance of particular ones the memory cells whose resistance is above a particular level.

The decrease in resistance during the trim operation is self-limiting in that the cells stop decreasing in resistance when the particular amount of resistance is reached. Additionally, only those cells having a resistance beyond the threshold level are affected by the trim operation. Cells that are already in the appropriate range of resistance will not experience a shift in resistance, even though they are subjected to the reverse bias trim voltage. Thus, those cells depicted in FIG. 5 with a resistance below the target level 258 are not affected by the reverse bias for the trim operation.

Figure 7:
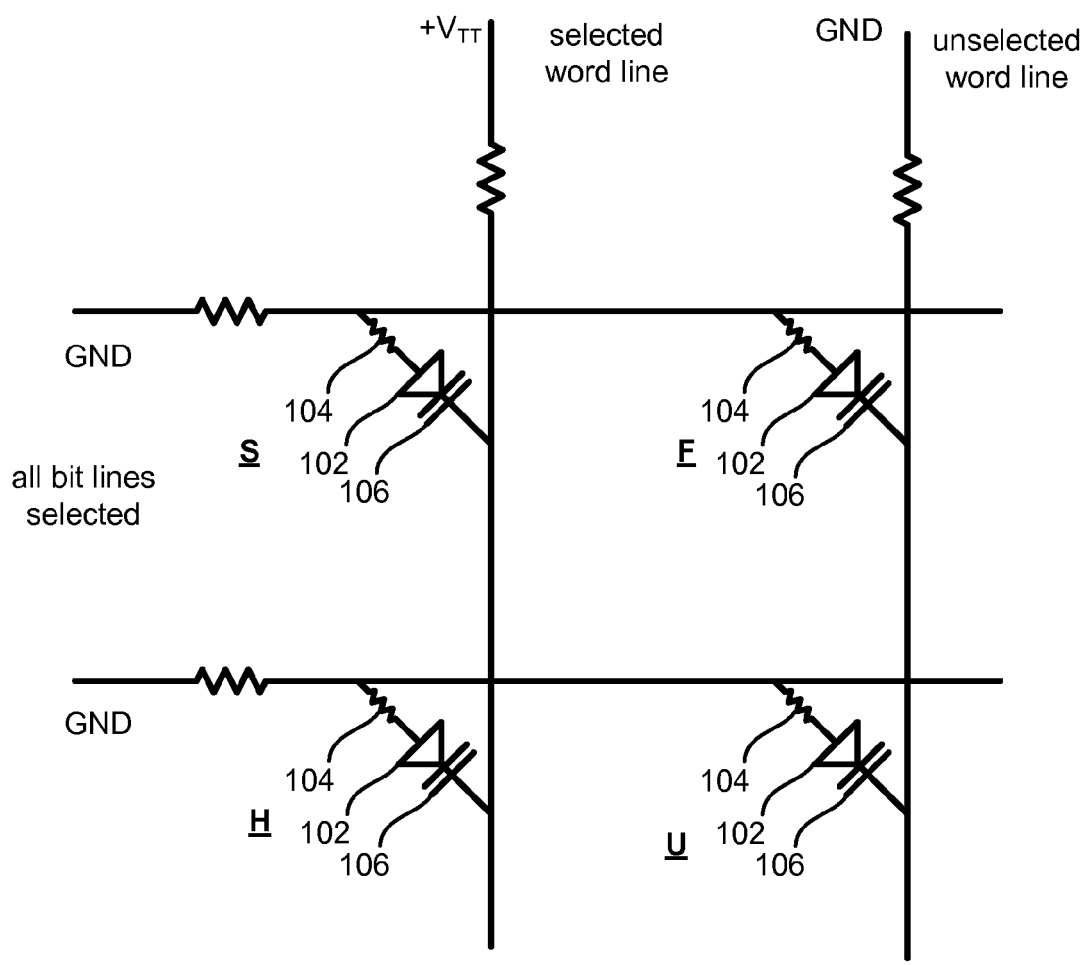
FIG. 7 is a simplified circuit diagram of a memory array illustrating the bias conditions for a reverse bias trim operation in accordance with one embodiment.

FIG. 7 is a circuit diagram depicting a reverse bias trim operation for the reset state of a non-volatile memory system in accordance with one embodiment. One or more selected word lines are supplied a trim voltage signal $V_{WT}$ at a positive voltage level $+V_{TT}$ to apply a reverse bias for the trim operation. $V_{TT}$ is the amount of reverse bias applied to the selected cells during trimming in one embodiment. In the bias scenario of FIG. 7, the selected bit lines are grounded so the full amount of the trim bias is applied to the selected word lines as $+V_{TT}$ to create a reverse bias across each selected cell equal to this amount. In one embodiment, the amount of trim reverse bias $V_{TT}$ is equal to about 60% the overall reverse reset bias level of $V_{RR}$. Continuing with the example above, if the reverse bias reset potential is equal to about 12V, the reverse bias trim potential $V_{TT}$ can be about 6V or 7V. Accordingly, +6V or +7V is applied to the selected word lines in one embodiment.

Other bias conditions can be used for a trim operation in accordance with one or more embodiments of the present disclosure. For example, a voltage of $+\frac{1}{2}V_{TT}$ is applied to the selected word lines while a voltage of $-\frac{1}{2}V_{TT}$ is applied to the selected bit lines in one embodiment. The resulting reverse bias across each cell is the same as described earlier ($V_{TT}$), however, the individual biases have been distributed across the different types of array lines.

Because only those cells that need to be shifted in resistance are affected by the reverse bias trim, the operation is not data-dependent and can be implemented for high bandwidth applications. A high bandwidth operation is used in one embodiment to trim a large group of memory cells simultaneously. In one example, every bit line of a block of memory cells is selected for the trim operation at once. One word line from the block is selected and the operation repeated for each word line. Additionally, multiple blocks within an array can be simultaneously selected during the trim operation, although a single block is selected in one embodiment. Utilizing this technique, a large number of cells is trimmed at once to not unreasonably affect the bandwidth of the reset operation. In other embodiments, other groupings can be used. One or more bit lines and one or more word lines from multiple blocks across the array can be selected in one embodiment.

Figure 8:
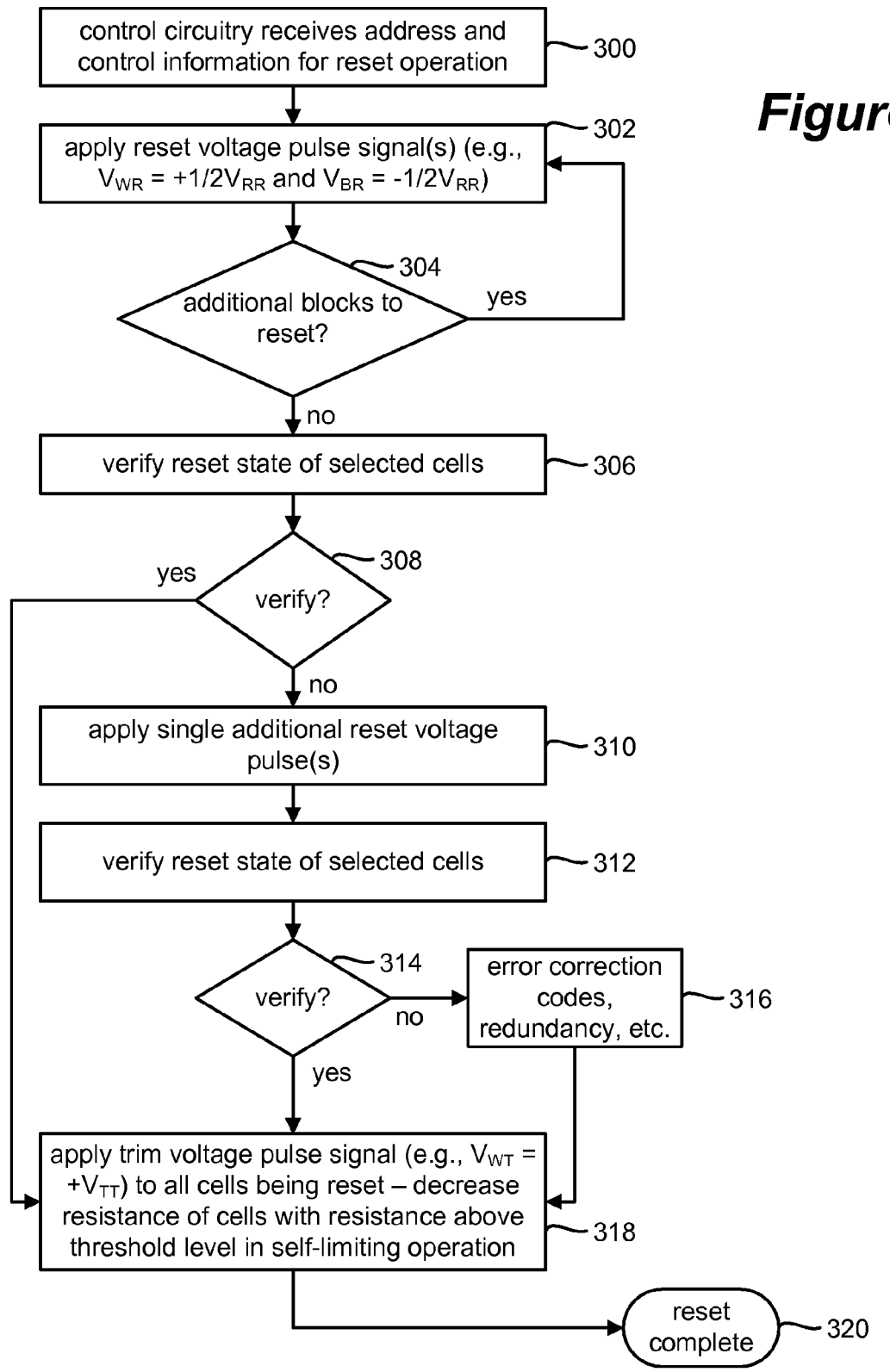
FIG. 8 is a flowchart of a method for resetting an array of memory cells that incorporates a trim operation in accordance with one embodiment.

FIG. 8 is a flowchart of a method for resetting memory cells in accordance with one embodiment that incorporates a reverse bias trim operation. Row and column control circuitry for an array of memory cells receive address and control information designating the selected cells for reset at step 300. In a re-writable array, for example, an erase request for the selected cells may be received while in a multi-state array, a write request may be received. Fulfilling the write or erase request can include resetting the selected cells as illustrated.

At step 302, one or more reset voltage pulse signals are applied to the cells being reset. The reverse reset bias can be applied across the selected cells using a combination of voltages on the selected word and bit lines as described. For example, the word line voltage signal $V_{WR}$ can include a positive voltage pulse (e.g., $+\frac{1}{2}V_{RR}$) and the bit line voltage signal $V_{BR}$ include a negative voltage pulse (e.g., $-\frac{1}{2}V_{RR}$) to reverse bias the selected cells in one embodiment.

At step 304, the method returns to apply an additional pulse(s) if memory cells to be reset remain, or continues to step 306 if all cells to be reset have received a reset voltage pulse. Smaller portions of the array may be subjected to individual reset pulses to minimize leakage currents through half-selected or unselected cells in one embodiment. For example, each iteration of steps 302 and 304 can apply a pulse to one (or in other cases more than one) block from each bay of many bays in the memory (e.g., 16 to 2024 bays or more) until every selected bit line has received a reset voltage pulse in one implementation. Other numbers of bit lines and/or word lines can be selected at step 302 in other embodiments. U.S. patent application Ser. No. 11/461,359, entitled "Memory Array Incorporating Two Data Busses for Memory Array Block Selection," and U.S. patent application Ser. No. 11/461,362, entitled "Hierarchical Bit Line Bias Bus for Block Selectable Memory Array," describe techniques for increased parallel access to a memory array such as array 302.

After applying a reverse bias reset voltage pulse to each selected memory cell, a verify operation is performed by reading back the resistance state of the devices at step 306. Step 306 can include determining if the resistance of a memory cell has increased to be at or above a minimum threshold resistance. Various techniques including sensing the current or voltage of a selected cell under a reference set of bias conditions can be used at step 306 to determine if a memory cell is adequately reset. U.S. patent application Ser. No. 11/461,343, entitled "Apparatus for Reading a Multi-Level Passive Element Memory Cell Array," describes suitable reading techniques that may be used for a read back operation to verify the reset state. At step 308, the reset operation branches for those bit lines having a memory cell that is not adequately reset. A retry pulse is applied to those memory cells utilizing the word and/or bit line voltage signals $V_{WR}$ and $V_{BR}$ at optional step 310. The pulse is simultaneously applied to every bit line having a memory cell not adequately reset in one embodiment. Various groupings of the bit lines can be used and individual pulses applied. In one embodiment, no retry pulses are applied. A verify operation is performed for the cells at step 312 if a retry pulse is used. If the cells undergoing the retry operation are not adequately reset as determined at step 314, they are managed using error correction codes or replaced with redundant memory cells, etc. at step 316.

As a result of the reset voltages applied at steps 302 and 314, certain cells may have been deeply reset to a highly resistive state as described. A tighter distribution of resistances for the reset state will provide a greater margin between states and consequently, a more reliable device. Accordingly, after successfully verifying cells at steps 308 and 314, or handling any cells that have not reset at step 316, a trim operation is performed for the cells to be reset at step 318.

Step 318 is performed simultaneously for every cell undergoing the reset operation in one embodiment. Because the operation is self-limiting cells that are not overly or deeply reset can also be subjected to the trim bias without negative effects. These cells will not undergo a further resistance shift. Moreover, those cells that are trimmed to a lower resistance will stop their resistance change when they reach a level associated with the trim bias.

A reverse bias trim voltage $V_{TT}$ is applied to the cells in one embodiment as described. A smaller amount of reverse bias is applied in one embodiment to decrease resistance during a trim operation than to increase the resistance during a reset operation. After applying the reverse bias trim voltage $V_{TT}$ to each cell, the reset operation is complete at step 320. Numerous variations to the method depicted in FIG. 8 can be made in accordance with embodiments. For example, the trim operation at step 318 may be incorporated after completing steps 302 and 304 for all the cells being reset and before verifying at step 306.

Figure 9A:
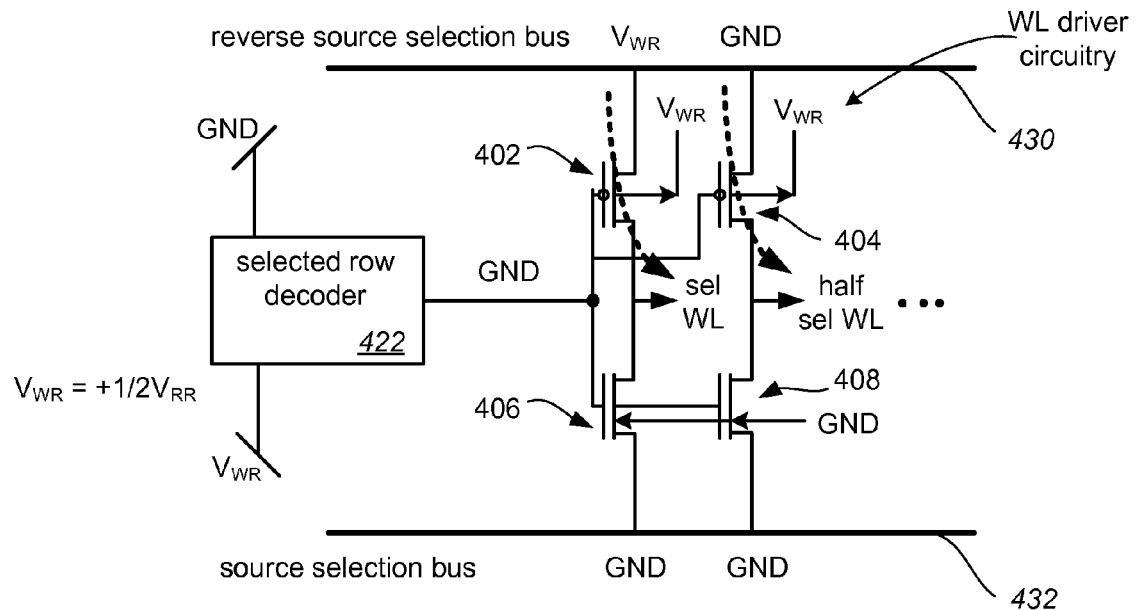
FIGS. 9A and 9B are circuit diagrams of a portion of row control circuitry that can be used in accordance with one embodiment to provide the reverse bias reset conditions of FIG. 6.
Figure 9B:
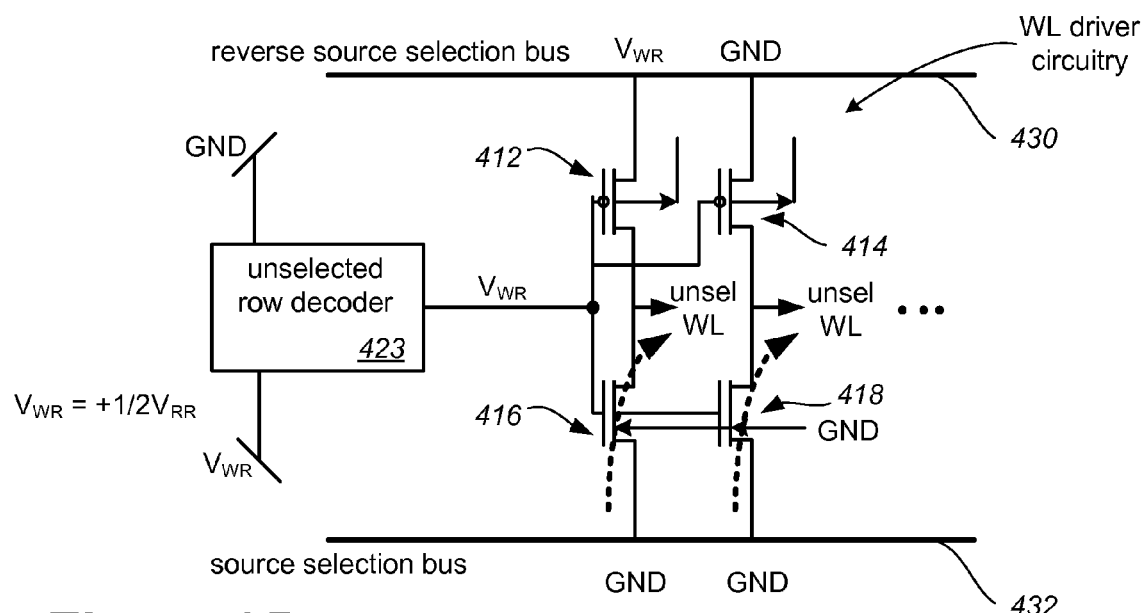

FIG. 9A depicts an embodiment of a portion of row control circuitry 220 that can be used to apply the reverse bias reset conditions of FIG. 6. Row decoder 422 corresponds to a selected word line during the reset pulse and outputs ground to the NMOS/PMOS word line driver circuitry (e.g., 224 in FIG. 4). The ground input for the driver circuitry turns on the upper PMOS devices 402 and 404. The ground input causes the driver circuitry to pass the reverse source selection bus signals $V_{WR}$ and GND to the selected word line and each half-selected word line associated with decoder 422, respectively. Each row decoder 423 corresponding to an unselected word line outputs $V_{WR}$ to its respective driver circuitry, as depicted in FIG. 9B. The positive bias of $V_{WR}$ turns on the NMOS devices 416 and 418 of the driver circuitry of the unselected word lines. Accordingly, the source selection bus levels (both GND) are selected and driven on each corresponding unselected word line. In one embodiment, the word line reverse reset voltage $V_{WR}$ is equal to about $+\frac{1}{2}V_{RR}$ as previously described. $V_{WR}$ can provide other voltage levels as well. For example, one or more reverse reset voltage pulses having a sloped pulse (e.g., beginning at $+\frac{1}{2}V_{RR}$ and increasing thereafter) as described hereinafter can be provided for the reset operation.

Figure 10A:
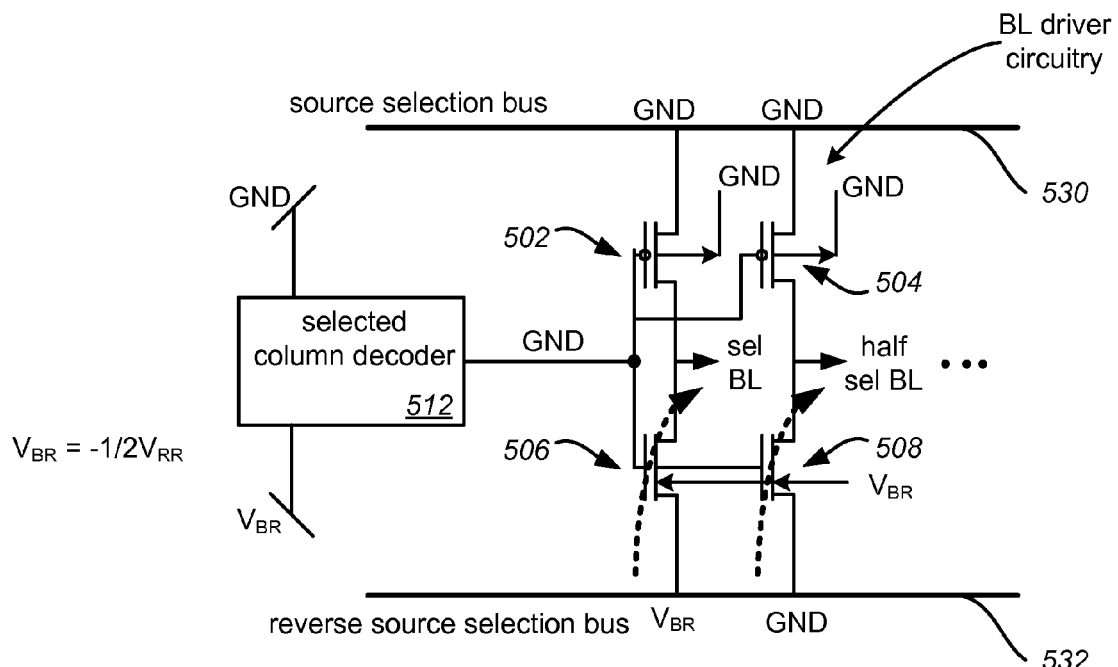
FIGS. 10A and 10B are circuit diagrams of a portion of column control circuitry that can be used in accordance with one embodiment to provide the reverse bias reset conditions of FIG. 6.
Figure 10B:
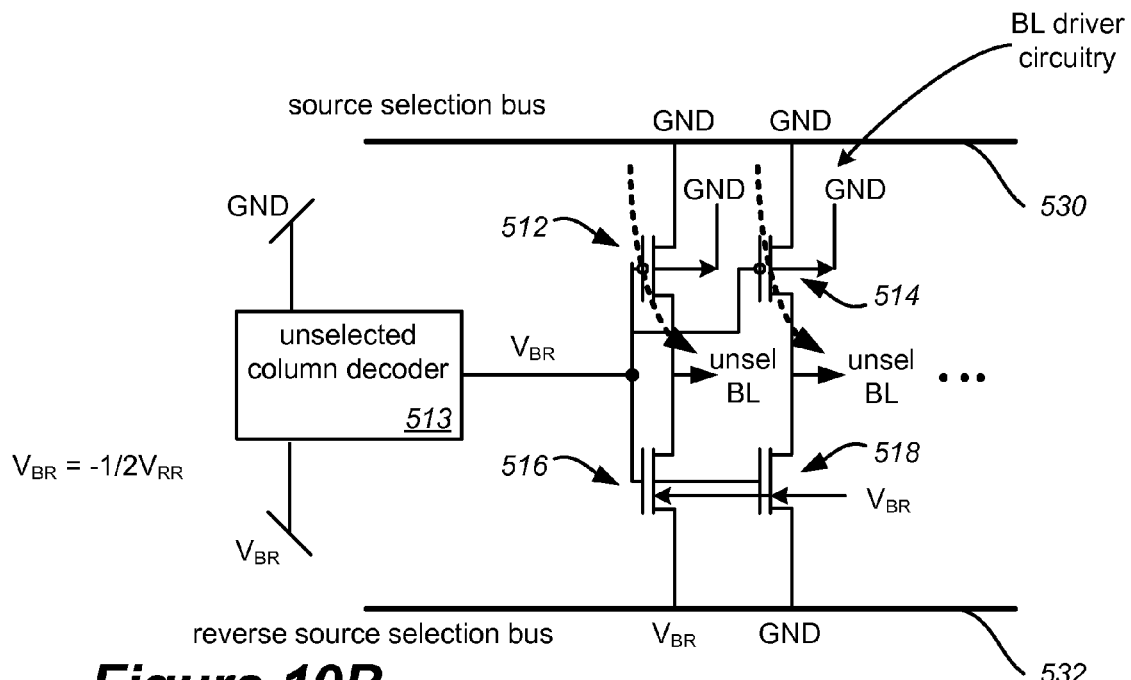

FIGS. 10A and 10B are circuit diagrams of a portion of column control circuitry 210 that can be used to apply the bias conditions for the reverse reset operation. Column decoder 512 controls a selected bit line driver to provide the selected bit line voltage pulse $V_{BR}$. $V_{BR}$ provides a voltage pulse of $-\frac{1}{2}V_{RR}$ in one embodiment. Column decoder 512 can be shared across multiple bit line drivers (e.g., 24) and also connect the half-selected bit lines to ground bias just prior to application of the reset pulses. The half-selected bit lines float near ground during the application of the pulse. The large number of unselected cells on half-selected bit lines provide a leakage current that keeps half-selected bit lines near ground. The memory cells sharing a column decoder with the selected bit line may be half-selected memory cells during a reset operation in one embodiment. The cells may connect to the selected word line during the reset operation for example. The selected column decoder 512 outputs GND to the input of the driver circuitry for the column decoder. The GND input at the NMOS/PMOS pair of the driver circuitry will turn on the lower NMOS device 506. The reverse source selection bus level $V_{BR}$ is passed to the selected bit line. Unselected row decoder 513 provides $V_{BR}$ to the gates of its respective driver circuitry, which selects the PMOS devices at the top of each driver pair. The source selection bus signal levels (all at GND) are provided to each unselected word line corresponding to decoder 513.

Figure 11A:
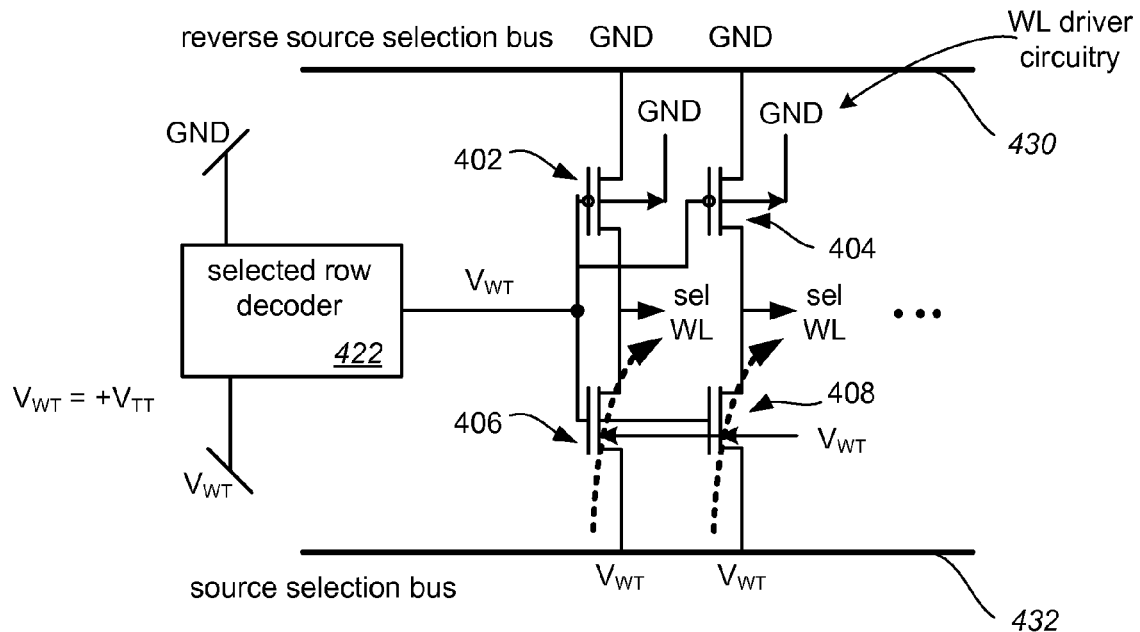
FIGS. 11A and 11B are circuit diagrams of a portion of row control circuitry that can be used in accordance with one embodiment to provide the reverse bias trim conditions of FIG. 7.
Figure 11B:
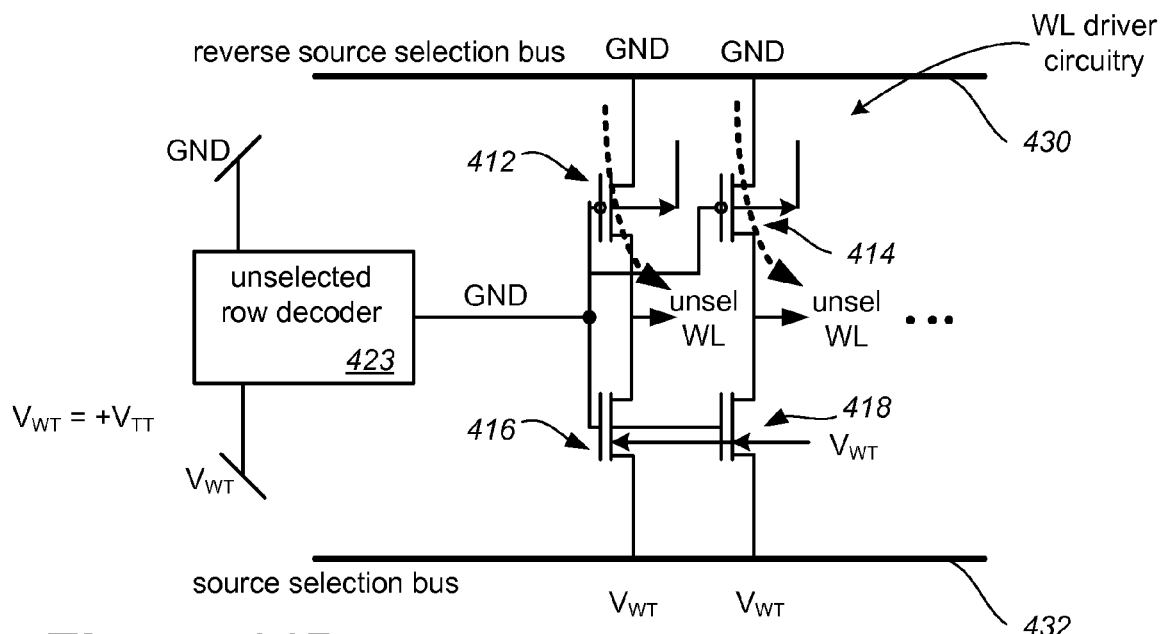

FIG. 11A depicts an embodiment of a portion of row control circuitry 220 that can be used to apply the reverse bias trim conditions of FIG. 7. Selected row decoder 422 outputs a word line trim voltage pulse $V_{WT}$ to the NMOS/PMOS word line driver circuitry. $V_{WT}$ is a positive voltage and turns on the lower NMOS devices 406 and 408. The driver circuitry passes the source selection bus signals $V_{WT}$ to the selected word lines. Each unselected row decoder 423 outputs GND to its respective driver circuitry, as depicted in FIG. 11B. The upper PMOS devices 412 and 414 are turned on and the GND signal from the reverse source selection bus is passed to each unselected word line.

FIG. 10A is a circuit diagram of a portion of column control circuitry 210 that can be used to apply the bias conditions for the reverse bias trim operation. Selected column decoder 512 controls a selected bit line driver, turning on the upper PMOS devices and passing GND to every bit line selected for the reset operation. The trim operation is not data dependent and a large number of cells can be selected at once given the self-limiting nature of the operation. Accordingly, every bit line in a selected block receives the GND level signal to apply the reverse bias trim voltage levels.

The driver circuitry associated with the row and column decoders shown in FIGS. 9A-10B may include additional NMOS/PMOS device pairs that form the driver selection circuitry for additional word lines and bit lines. For example, each set of drivers for the row control circuitry may include 16 NMOS/PMOS pairs that connect to 16 different word lines of the array and are associated with a single row decoder. Each set of drivers for the column control circuitry may include 12 NMOS/PMOS pairs that connect to 12 different word lines of the array and are associated with a single column decoder. This configuration is exemplary and others may be used in accordance with embodiments. Such a configuration as described, however, can advantageously provide a reasonable fan out of the array lines at each memory level. It also facilitates placement of the driver circuitry on the same pitch as the array lines with which it is associated. In addition to accommodating the large number of array lines, this arrangement can avoid long transmission of the various driver voltage levels to the array and consequently improve power performance. More details regarding driver and control circuitry for controlling a memory array, including a dual bus architecture suitable for implementing data dependent selection of both selected and unselected word and/or bit lines in one embodiment, can be found in U.S. patent application Ser. No. 11/461, 352, entitled "Dual Data-Dependent Busses for Coupling Read/Write Circuits to a Memory Array," by Roy E. Scheuerlein and Luca G. Fasoli.

Differences in device characteristics can affect the behavior of individual memory cells within memory array 202 during reverse reset operations as just described. Memory cells may have different dimensions that result from the fabrication process. The material compositions for example polysilicon material, between devices may lack certain uniformity. This can result in some cells that may reset at a lower voltage bias while other cells may reset at a higher voltage bias, when compared with the nominal level of an average cell in the array. To adequately reset an array of memory cells in accordance with one embodiment of the present disclosure, including variances among individual memory cells, at least one voltage pulse applied to the selected memory cells of the array during a reset operation has an amplitude with a changing slope to gradually increase the reverse bias applied to the selected memory cells. Cells requiring a larger reset voltage level will reset at the higher reverse bias after the amplitude of the voltage pulse has changed while cells only requiring a lower reset voltage level will reset at a smaller level of reverse bias. This technique accommodates variances between devices while also providing an efficient process that will not damage the devices being reset. Because a single reset voltage pulse can be applied to create a range of reverse bias reset conditions, time-consuming verify operations are avoided or minimized. The single pulse can be applied across each cell while the amplitude changes to increase the reverse bias. Cells that reset at lower values of the reset voltage pulse will automatically turn-off when they reset to the higher resistance state. The higher resistance after reset will decrease or stop the current flow through these devices, ensuring that they are not damaged by the higher values of reset voltage.

Figure 13A:
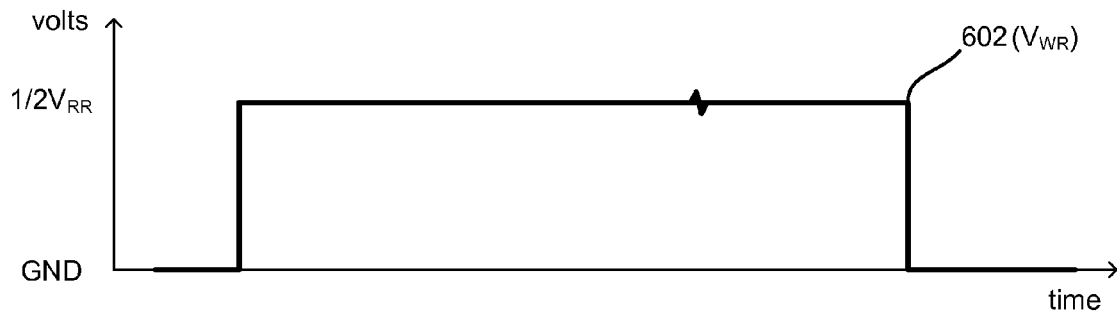
FIGS. 13A and 13B depict exemplary bit line and word line reset voltage signals in accordance with one embodiment for generating an increasing reverse bias during reset operations.
Figure 13B:
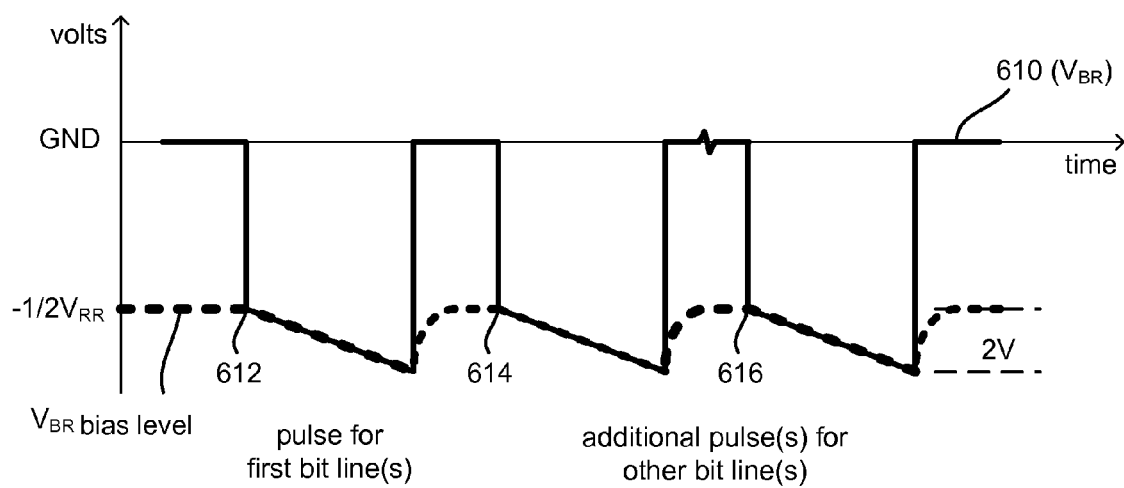

FIGS. 13A-13B depict reset voltage signals in accordance with one embodiment that can be applied to selected word lines and bit lines, respectively, during a reset operation as shown in FIG. 6. A word line reset voltage signal $V_{WR}$ is depicted in FIG. 13A that rises to a maximum value of about $+\frac{1}{2}V_{RR}$ (e.g., +6V) for the duration of the portion of the operation depicted. A bit line reset voltage signal $V_{BR}$ is depicted in FIG. 13B having a starting value of $-\frac{1}{2}V_{RR}$ for each reset voltage pulse. The reset signal on the bit line has an amplitude that changes according to a substantially constant slope. In FIG. 13B, the bit line reset voltage signal increases from an initial value of about $-\frac{1}{2}V_{RR}$ to an ending value of about $-(\frac{1}{2}V_{RR}+2V)$. The magnitude of the amplitude for each negative bit line pulse increases by about 2V (to $-8V$ for example) to gradually increase the reverse bias applied across the selected portion of the array. The amplitude of the VBR pulse is limited to the VBR bias level shown by the dotted line in FIG. 13B by the output of a charge pump circuit as shown in FIG. 10B. The VBR bias level returns to its initial value between application of the VBR pulses by controlling counter 712 in FIG. 14B. With the diodes of each memory cell aligned as shown in FIG. 6 from bit line to word line, the constant value of the word line reset voltage signal and the increasing negative voltage of the bit line reset voltage signal increases the reverse bias applied to each memory cell along the selected bit line and selected word line. Multiple pulses are shown for the bit line reset voltage signal as may be used to individually reset smaller portions of the array. For example, a first reset voltage pulse may be applied to one bit line in each of several selected blocks (sub-arrays) and a second pulse applied to a second bit line in each of the several selected blocks. More reset pulses are applied to yet more bit lines until al the data supplied by the user is encoded. This technique may require 16 to 64 or more reset voltage pulses inversely dependent on how many blocks are used to store a page of user data.

The starting and ending values for $V_{BR}$ can vary by implementation. In one embodiment, statistical data or experimentation is used to select the optimal starting and ending values for each pulse. For example, the initial value of the pulse may be chosen to create a reverse bias determined to be the minimum any cell will need before resetting from the lower resistance state to the higher resistance state. The ending value of each pulse may be chosen to create the largest reverse bias typically needed to reset any cell of the array. By gradually applying an increasing reverse bias, the memory cells that reset at a lower reset reverse bias level can avoid being damaged at the increased reverse bias levels. When a memory cell resets to the higher resistance reset state, it will conduct less current and behave in a self-limiting manner. It will turn itself off or stop conducting to a sufficient extent when it has successfully reset. This self-limiting cutoff will avoid damage under the reverse bias conditions. It is noted that gradually increasing the amplitude of a reset pulse from a starting value to a larger ending value to thereby increase the reverse bias for selected memory cells does not have the same electrical effects as applying a constant pulse with a larger starting value. A pulse having a larger starting value may damage the material forming the resistance change element or cause a permanent shift in resistance. Therefore, one embodiment of the disclosed technology utilizes a sloped reverse reset pulse to successfully and safely erase memory cells having different device characteristics.

Figure 12:
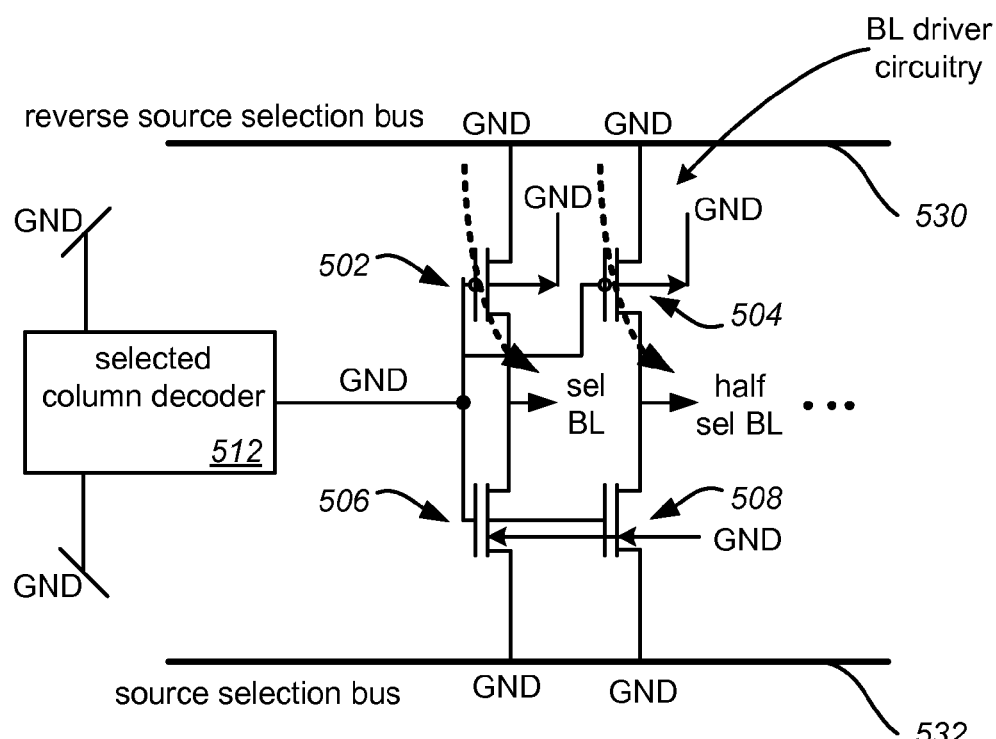
FIG. 12 is a circuit diagram of a portion of column control circuitry that can be used in accordance with one embodiment to provide the reverse bias trim conditions of FIG. 7.
Figure 14A:
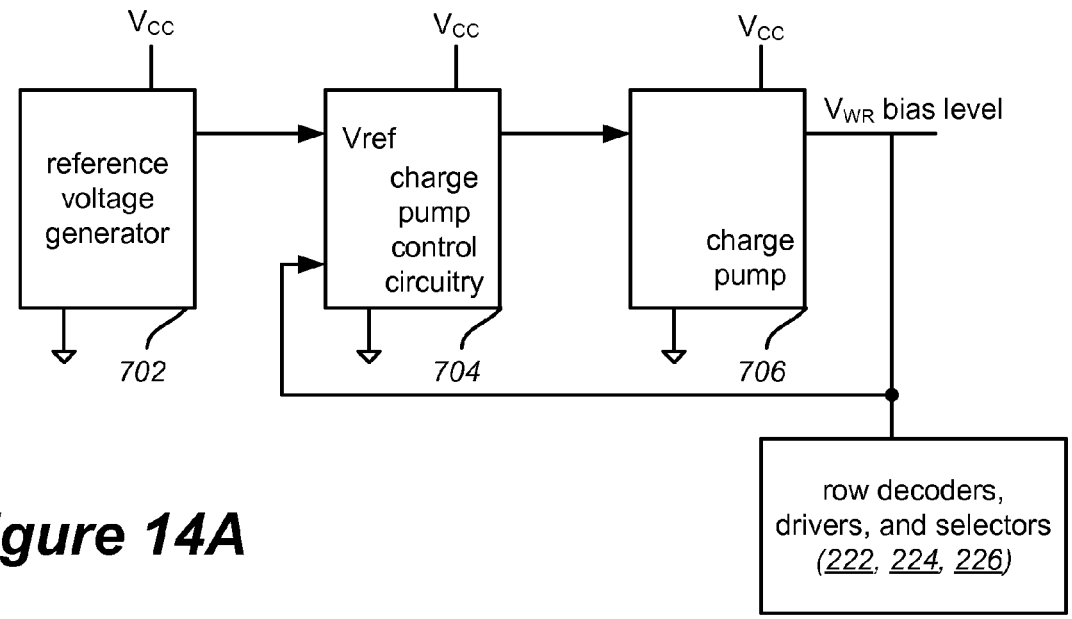
FIGS. 14A and 14B are circuit diagrams for a portion of the control circuitry that can be used to generate sloped pulse reset voltage signals as illustrated in FIGS. 11A and 11B.
Figure 14B:
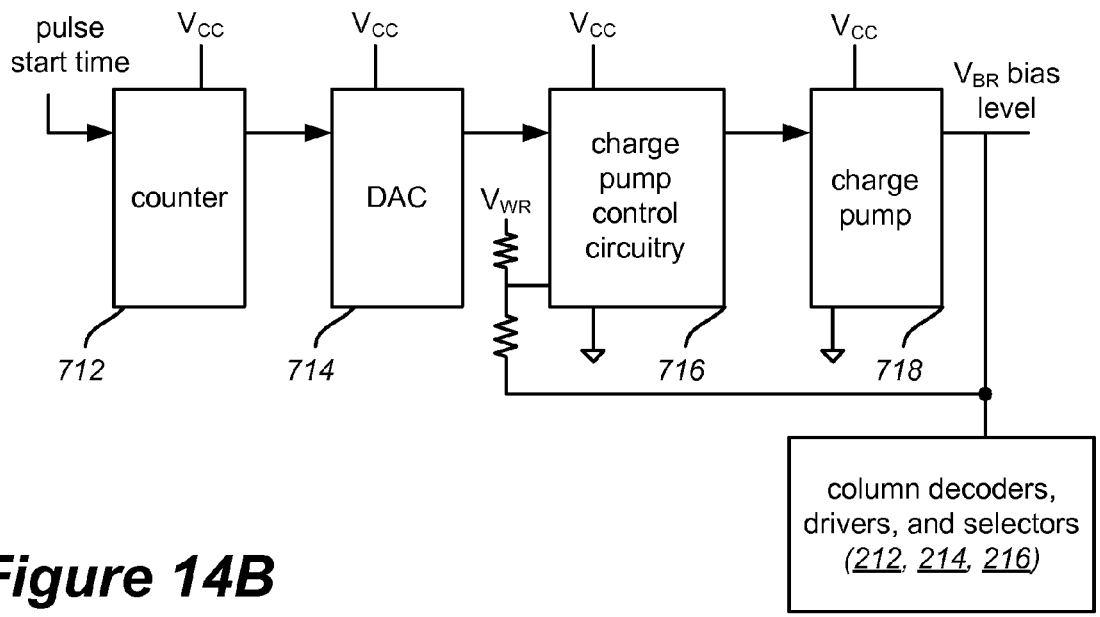

A portion of row control circuitry and column control circuitry that can provide reset voltage signals in one embodiment are depicted in FIGS. 12A and 12B, respectively. A charge pump 706 in FIG. 14A provides the reverse reset VWR bias level through row control circuitry including a reverse source selection bus pulse generator to the reverse source selection bus (e.g., bus 430 in FIGS. 9A-12) and directly to row decoder circuits (e.g., decoder 322 in FIG. 4). Reference voltage generator 702 receives a supply voltage $V_{CC}$ and provides a reference voltage $V_{ref}$ to charge pump controller 704. Using a feedback signal from the output of charge pump 706, the controller can provide a starting $V_{WR}$ bias level of about $\frac{1}{2}V_{RR}$ as needed.

The column control circuitry depicted in FIG. 12B utilizes a counter 712 and digital to analog converter 714 to generate the bit line reset voltage $V_{BR}$ bias level having a negative sloped pulse output (negative level and slope). Counter 712 receives a pulse start time and using a clock signal, provides a pulsed input to DAC 714 to generate a analog sloped pulse output. DAC 714 receives the digital input and provides voltage levels to the charge pump controller. Charge pump 718 generates a negative bit line reset voltage $V_{BR}$ that increases according to a substantially constant and negative slope produced from the counter. The amplitude of the negative voltage $V_{BR}$ bias level increases according the defined slope to gradually increase the reverse bias applied across the memory array.

Figure 15A:
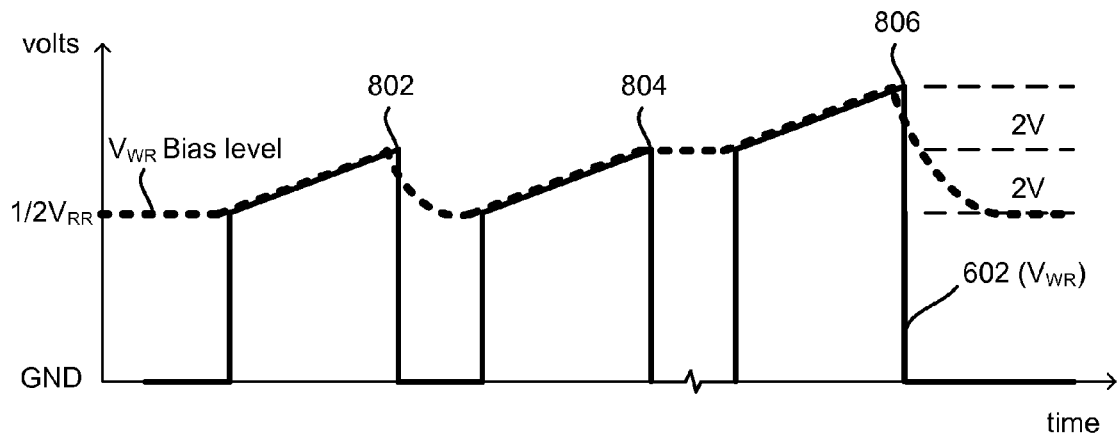
FIGS. 15A and 15B depict other exemplary bit line and word line reset voltage signals in accordance with one embodiment for generating an increasing reverse bias during reset operations.
Figure 15B:
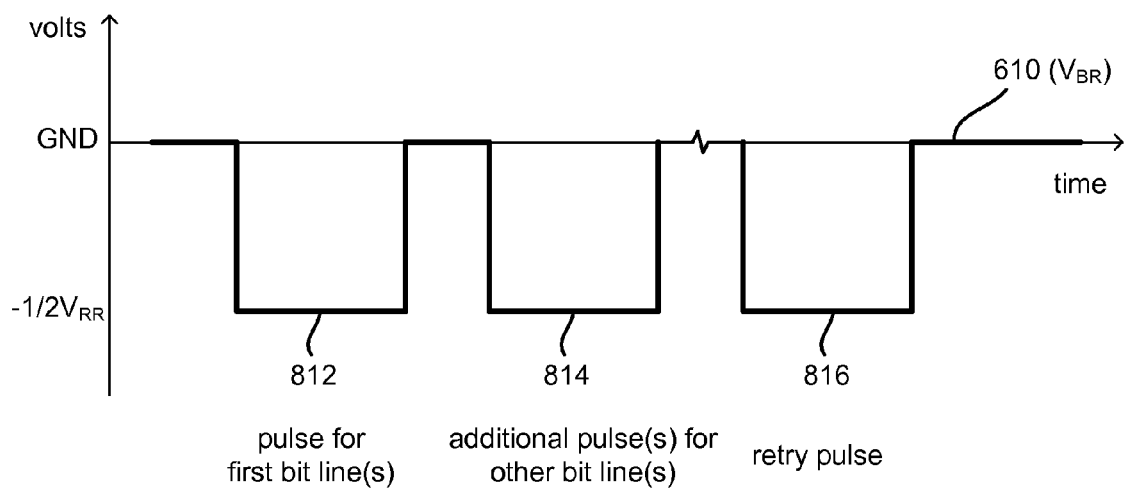

An alternative set of voltage signals for applying the reverse bias of FIG. 6 is depicted in FIGS. 15A and 15B. A positive voltage pulse $V_{WR}$ is applied to the selected word line(s) and increased according to a positive slope. A negative bit line voltage pulse $V_{BR}$ is applied on the selected bit line(s). Each word line voltage pulse begins at a starting value of about +5V and increases by 2V to around +7V. The magnitude of the $V_{WR}$ pulse is limited to the $V_{WR}$ bias level from the output of the charge pump circuit and is shown by the dotted line in FIG. 15A. The combination of the word line and bit line reset pulses will provide an increasing reverse bias across each selected memory cell. Additional bit line reset voltage pulses are depicted as may be used to set or reset additional groupings of bit lines. As with FIGS. 9A-9B, the pulses of FIGS. 11A-11B can be used to create a forward bias in some embodiments. In another embodiment, the pulses are not sloped. For example, a first voltage pulse having a negative polarity can be applied to a first array line and a second voltage pulse having a positive polarity applied to a second array line to create a reverse bias. This arrangement can also switch the resistance of the memory cells, but does not include a slope on the pulses or a resulting shift in the bias applied.

The embodiment of FIGS. 15A and 15B includes a retry technique using a slightly higher reset pulse level determined by the $V_{WR}$ bias level for memory cells that do not reset under application of the initial voltage pulse. For example, the results of resetting a selected portion of the array can be verified after applying the last reset voltage pulses 804 and 814. A verify operation can include reading back the resistive state of the memory cell and comparing it with the predefined level for the reset state. Any columns or bit lines that are not reset can be subjected to a retry pulse at a higher level. The starting value of the word line voltage pulse 806 is increased to 7V and increases to a level of 9V. The value of any retry pulse may vary by embodiment and can be selected based on statistical data and/or testing as previously described. In FIGS. 15A and 15B, the retry pulse is applied to each bit line of the array that fails to verify for a reset state. In other embodiment, a retry pulses (or multiple pulses) can be applied after individual applications of the initial reset voltage pulses. If a column or other grouping of cells fails to verify for the target resistive state after a retry pulse (or multiple retry pulses), they can be handled using error correction control techniques or replaced with redundant memory cells.

Figure 16A:
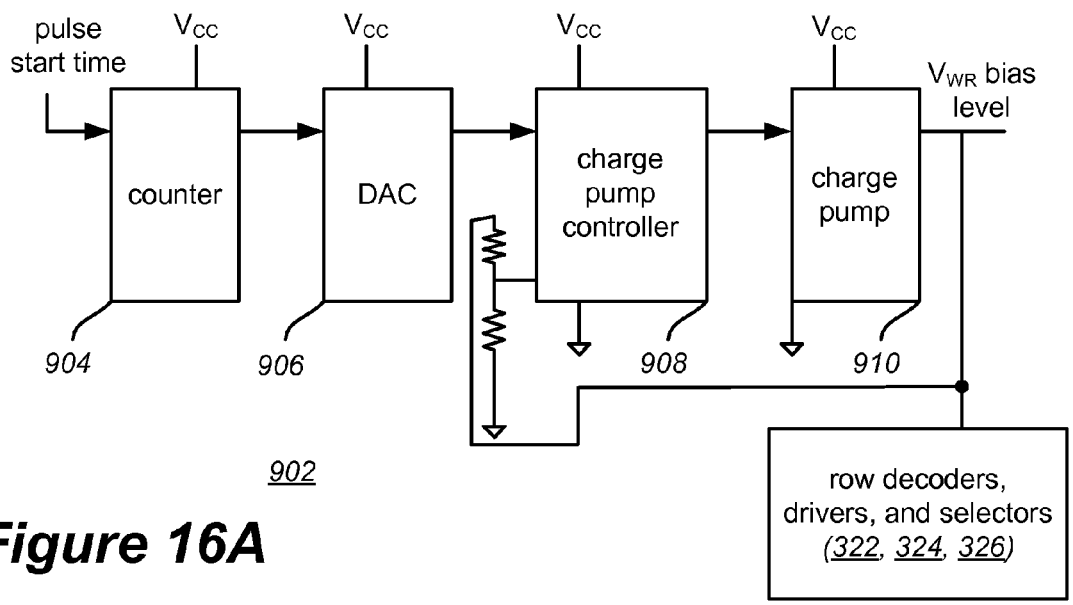
FIGS. 16A and 16B are circuit-level diagrams for a portion of control circuitry that can be used to generate sloped reset pulse signals as illustrated in FIGS. 9A and 9B.
Figure 16B:
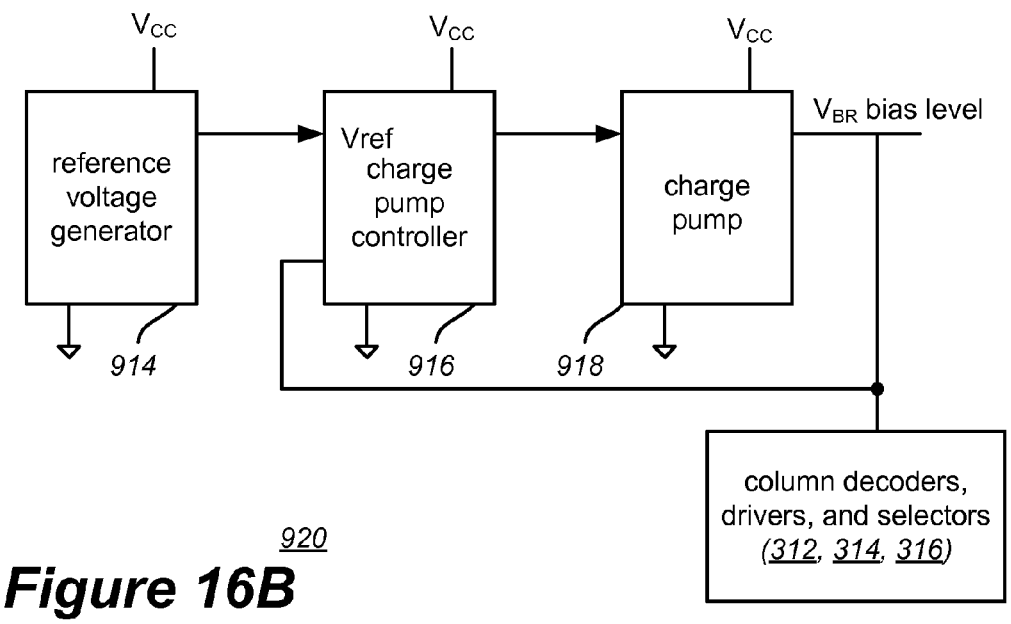

FIGS. 16A and 16B depict portions of the row and column control circuitry that can be used to provide the pulses of FIGS. 13A and 13B in accordance with one embodiment. The selected word lines provide a positive reset signal in this embodiment having an amplitude that increases according to a positive slope. A counter 904 and digital to analog converter 906 are utilized when driving charge pump controller 908. Controller 908 uses the analog output of DAC 906 and creates a positively sloped $V_{WR}$ bias level via charge pump 910. The output of charge pump 910 is applied directly to the word line decoders and through reverse source selection bus pulse generation circuitry to the reverse source selection bus line. A portion of the column control circuitry 210 for providing the negative $V_{BR}$ bias level is depicted in FIG. 16B. A reference voltage generator 914 delivers a reference voltage $V_{ref}$ to charge pump controller 916. The controller utilizes a feedback loop from the output of charge pump 918 to maintain a steady value of $V_{BR}$ bias for the bit line reset voltage signal.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A method of operating non-volatile storage, comprising:
switching a plurality of non-volatile storage elements from a lower resistance state to a higher resistance state by applying a first level of reverse bias to said storage elements, said storage elements each including a diode; and
applying a second level of reverse bias to said storage elements to lower a resistance of a subset of said storage elements having a resistance beyond a target level corresponding to said higher resistance state after switching said storage elements.

2. The method of claim 1, wherein:
said first level of reverse bias is higher than said second level of reverse bias.

3. The method of claim 2, wherein:
said second level of reverse bias is about 60% the level of said first level of reverse bias.

4. The method of claim 1, wherein:
applying a first level of reverse bias comprises applying a positive voltage pulse to a first array line in communication with said storage elements and applying a negative voltage pulse to a second array line in communication with said storage elements; and
applying a second level of reverse bias comprises applying a positive voltage pulse to said first array line and a fixed bias to said second array line.

5. The method of claim 1, wherein:
said plurality of non-volatile storage elements each include a resistivity change material in series with said diode;
applying said first level of reverse bias increases a resistivity of said resistivity change material for each storage element of said plurality;
applying said second level of reverse bias decreases said resistivity of said resistivity change material for each storage element of said subset.

6. The method of claim 5, wherein:
said resistivity change material is polysilicon.

7. The method of claim 5, wherein:
said resistivity change material is a metal oxide.

8. The method of claim 5, wherein:
said resistivity change material forms at least a portion of said diode.

9. The method of claim 5, wherein:
said plurality of non-volatile storage elements each include an anti-fuse in series with said resistivity change material.

10. The method of claim 1, wherein:
said plurality of non-volatile storage elements are part of a three-dimensional monolithic memory array.

11. The method of claim 10, wherein:
said array includes a first plurality of array lines and second plurality of array lines substantially perpendicular to said first plurality; and
at least one of said first plurality of array lines and said second plurality of array lines include individual lines that are shared between memory levels of said three-dimensional array.

12. The method of claim 1, wherein:
said lower resistance state corresponds to a set state for said storage elements; and
said higher resistance state corresponds to a reset state for said storage elements.

13. The method of claim 12, wherein:
said lower resistance state is a programmed state for said storage elements.

14. The method of claim 13, wherein:
said plurality of non-volatile storage elements include more than two states.

15. The method of claim 13, wherein:
said plurality of non-volatile storage elements are multi-state storage elements.

16. The method of claim 12, wherein:
said plurality of non-volatile storage elements are part of an array forming a one-time field-programmable memory;
said lower resistance state is a formatted state for said storage elements.

17. The method of claim 1, wherein:
applying said second level of reverse bias does not substantially alter a resistance of storage elements of said plurality having a resistance within said target level.

18. A method of operating non-volatile storage, comprising:
applying at least one reverse bias reset voltage to a plurality of non-volatile storage elements having at least one resistance change element in series with a diode to reset said storage elements from a lower resistance set state to a higher resistance reset state; and
applying at least one reverse bias trim voltage to said plurality of non-volatile storage elements to lower a resistance of a first subset of said plurality of non-volatile storage elements having a resistance above a target value for said higher resistance reset state while not substantially lowering a resistance of a second subset of said plurality of non-volatile storage elements having a resistance at or below said target value.

19. The method of claim 18, wherein:
applying at least one reverse bias reset voltage includes applying a first level of reverse bias to said plurality of storage elements; and applying at least one reverse bias trim voltage includes applying a second level of reverse bias to said plurality of storage elements, said second level is less than said first level.

20. A method of operating non-volatile storage, comprising:
applying a first level of reverse bias to a plurality of non-volatile storage elements having a diode to move a resistance of each storage element in a first direction from a first resistance state to a second resistance state; and
applying a second level of reverse bias to said plurality of non-volatile storage elements to move a resistance of a subset of said plurality of storage elements having a resistance beyond a target resistance level for said second resistance state in a second direction toward said target resistance level.

21. The method of claim 20, wherein:
applying a first level of reverse bias increases a resistance of said plurality of non-volatile storage elements; and
applying a second level of reverse bias decreases a resistance of said subset of non-volatile storage elements to move said storage elements toward said target resistance level.

22. The method of claim 21, wherein:
applying a second level of reverse bias does not decrease a resistance of storage elements of said plurality having a resistance below said target resistance level.

* * * * *